(12) United States Patent
Heikkinen et al.

(10) Patent No.: US 8,514,021 B2
(45) Date of Patent: Aug. 20, 2013

(54) RADIO FREQUENCY INTEGRATED CIRCUIT

(75) Inventors: Jari Johannes Heikkinen, Espoo (FI); Jonne Juhani Riekki, Espoo (FI); Jouni Kristian Kaukovuori, Vantaa (FI)

(73) Assignee: Renesas Mobile Corporation, Tokyo (JP)

( * ) Notice: Subject to any disclaimer, the term of this patent is extended or adjusted under 35 U.S.C. 154(b) by 65 days.

(21) Appl. No.: 13/271,630

(22) Filed: Oct. 12, 2011

(65) Prior Publication Data

US 2012/0293265 A1  Nov. 22, 2012

Related U.S. Application Data

(63) Continuation-in-part of application No. 13/111,423, filed on May 19, 2011, now Pat. No. 8,378,748, and a continuation-in-part of application No. 13/224,430, filed on Sep. 2, 2011, now Pat. No. 8,427,239.

(30) Foreign Application Priority Data

May 19, 2011 (GB) .................................. 1108444.9
Sep. 2, 2011 (GB) .................................. 1115183.4

(51) Int. Cl.
*H03F 3/45* (2006.01)

(52) U.S. Cl.
USPC ............................. 330/260; 330/283; 330/307

(58) Field of Classification Search
USPC .................... 330/51, 252, 253, 277, 283, 311, 330/260, 291, 302, 307, 310
See application file for complete search history.

(56) References Cited

U.S. PATENT DOCUMENTS

| 6,094,084 A | 7/2000 | Abou-Allam et al. | 327/359 |
| 6,175,274 B1 | 1/2001 | Groe | 330/51 |
| 6,768,377 B2 | 7/2004 | Macedo | 330/51 |

(Continued)

FOREIGN PATENT DOCUMENTS

| CN | 101834576 A | 9/2010 |
| CN | 101951229 | 1/2011 |

(Continued)

OTHER PUBLICATIONS

Hsieh-Hung Hsieh et al., "Design of Ultra-Low-Voltage RF Frontends with Complementary Current-Reused Architectures," IEEE Transactions on Microwave Theory and Techniques, IEE Service Center, Piscataway, NJ, USA, vol. 49, No. 7, Jul. 1, 2007, pp. 1445-1458, XP011187189 (14 pages).

(Continued)

*Primary Examiner* — Khanh V Nguyen
(74) *Attorney, Agent, or Firm* — Robert P. Michal; Lucas & Mercanti LLP

(57) ABSTRACT

Embodiments of the invention are concerned with configurable RFICs. In an exemplary embodiment there is provided a configurable radio-frequency integrated circuit (RFIC) including one or more configurable low noise amplifier circuits, each of said one or more configurable low noise amplifier circuits being configurable between:
  an internal input impedance matching topology in which the respective low noise amplifier circuit includes one or more internal input impedance matching components adapted to match the input impedance of the respective low noise amplifier to a given input, said one or more internal input impedance matching components being located internally to the respective low noise amplifier circuit; and
  a topology different from said internal input impedance matching topology.

24 Claims, 20 Drawing Sheets

(56) References Cited

U.S. PATENT DOCUMENTS

| | | | |
|---|---|---|---|
| 6,933,779 B2* | 8/2005 | Lee et al. | 330/283 |
| 6,949,979 B2 | 9/2005 | Lu et al. | 330/305 |
| 7,084,707 B2 | 8/2006 | Razavi et al. | 330/302 |
| 7,266,360 B2 | 9/2007 | Kang et al. | 455/302 |
| 7,323,939 B2 | 1/2008 | Han et al. | |
| 7,474,158 B1 | 1/2009 | Yim et al. | 330/311 |
| 7,495,515 B1 | 2/2009 | Branch et al. | 330/305 |
| 7,622,989 B2* | 11/2009 | Tzeng et al. | 330/126 |
| 7,656,229 B2 | 2/2010 | Deng et al. | 330/149 |
| 7,679,436 B2 | 3/2010 | Jimenez et al. | |
| 7,714,657 B2 | 5/2010 | Wu | |
| 2005/0068106 A1 | 3/2005 | Irvine | 330/260 |
| 2006/0132242 A1 | 6/2006 | Han et al. | |
| 2008/0157876 A1 | 7/2008 | Tsuyoshi et al. | |
| 2009/0085668 A1 | 4/2009 | Gao et al. | |
| 2009/0140812 A1 | 6/2009 | Deng et al. | |
| 2010/0060363 A1* | 3/2010 | Han et al. | 330/306 |
| 2010/0237947 A1 | 9/2010 | Xiong et al. | 330/278 |
| 2010/0321113 A1 | 12/2010 | Kathiresan et al. | 330/278 |
| 2010/0328542 A1 | 12/2010 | Kammula et al. | |
| 2011/0003563 A1 | 1/2011 | Gorbachov | 455/78 |
| 2011/0018635 A1 | 1/2011 | Tasic et al. | |

FOREIGN PATENT DOCUMENTS

| | | |
|---|---|---|
| CN | 101951229 A | 1/2011 |
| EP | 0 837 559 A1 | 4/1998 |
| EP | 1 993 201 A1 | 11/2008 |
| JP | 2010087954 A | 4/2010 |
| KR | 2010-0077726 A | 7/2010 |
| KR | 101019716 B1 | 7/2010 |
| KR | 20100077726 A | 7/2010 |
| WO | WO 2007/085866 A1 | 8/2007 |

OTHER PUBLICATIONS

PCT International Search Report and Written Opinion mailed Aug. 31, 2012 issued in a related PCT international application No. PCT/IB2012/052499 (14 pages).

EP Combined Search and Examination Report under Sections 17 and 18(3) issued for corresponding GB Patent Application No. GB1117607.0 mailed Jan. 27, 2012.

EP Combined Search and Examination Report under Sections 17 and 18(3) issued for corresponding GB Patent Application No. GB1117608.8 mailed Feb. 8, 2012.

Bruccoleri, Federico, et al. *Wide-Band CMOS Low-Noise Apmplifier Exploiting Thermal Noise Canceling*; IEEE Journal of Solid-State Circuits, vol. 39, No. 2, Feb. 2004, pp. 275-282.

Notice of References Cited, issued in related U.S. Appl. No. 13/556,552 on Sep. 6, 2012 (1 page).

Communication entitled "Patents Act of 1977: Entitlement to earlier date under Section 15(9)", dated Aug. 20, 2012, issued by the U.K. Patent Office in related U.K. Application No. GB1207237.7 (2 pages).

Che-Sheng Chen, et al., "A 2.5GHz 90nm CMOS Triple Gain Mode LNA for WiMAX Applications," International Symposium on Signals, Systems and Electronics, ISSSE'07, pp. 367-369 (3 pages).

Shaeffer, D.K., et al., "A 1.5-V, 1.5-GHz CMOS Low Noise Amplifier", © 1997 IEEE, pp. 745-759.

Liao, C-F., et al., "A Broadband Noise-Canceling CMOS LNA for 3.1—10.6-GHz UWB Receivers", © 2007 IEEE, pp. 329-339.

Darabi, H., et al., A 4.5-mW 900-MHz CMOS Receiver for Wireless Paging, © 2000 IEEE, pp. 1085-1096.

\* cited by examiner

△ LNA configured to internal matching
▲ LNA configured to external matching

RADIO FREQUENCY INTEGRATED CIRCUIT

CLAIM OF PRIORITY FROM COPENDING PATENT APPLICATIONS

This application is a continuation-in-part of U.S. patent application Ser. No. 13/111,423 (filed May 19, 2011) and of U.S. patent application Ser. No. 13/224,430 (filed Sep. 2, 2011) and claims benefit under 35 U.S.C. §120 and 37 CFR 1.53(b)(2) to each of those applications. This application further claims benefit under 35 U.S.C. §119(a) and 37 CFR 1.55 to UK Patent Application No. GB1108444.9 (filed May 19, 2011) and UK Patent Application No. GB1115183.4 (filed Sep. 2, 2011).

TECHNICAL FIELD

This application relates to Radio Frequency Integrated Circuits (RFICs). In particular, but not exclusively, this application relates to configurable RFICs.

BACKGROUND

Radio-frequency (RF) platforms are high-volume products, which include several integrated circuits (ICs) for audio, power management, radio transceiver, etc. ICs can offer the best economical figures for mass-production products, since the mask costs are fixed which leads to decreasing unit costs as the number of fabricated ICs increases.

The over-the-air (OTA) performance defines the capabilities of the RF platform. OTA performance is an important selling factor and can be a crucial selection criterion for a potential customer, as well as the unit cost. OTA performance is a function of antenna performance and capabilities of RFIC and baseband ICs. Typically, the size of the antenna scales inversely to the RF frequency, i.e. antennas become larger when the wavelength increases. Within the user equipment (UE), the size of the antennas is limited due to a small form-factor product thus leading to sub-optimal antenna performance. Therefore, the platform performance can be degraded at frequencies below 1 GHz leading to decreased uplink/downlink performance.

State-of-the-art RFICs are designed to operate at several different bands, for example Global System for Mobile Communications (GSM) 850, 900, 1800, and/or 1900, Wideband Code Division Multiple Access (WCDMA), High Speed Packet Access (HSPA) and/or Long Term Evolution (LTE) Bands 1, 2, 3, etc. Typically, there is an RF filter (or duplex filter in the case of links utilising Frequency Division Duplexing (FDD)) placed between the antenna and RFIC to filter out unwanted radio signals. Due to different uplink/downlink configurations, there are several bands where the RF filter has considerable insertion loss (IL). The larger the IL is, the less sensitive (higher noise figure) the receiver will be. For example, WCDMA and LTE Bands 2 and 3 have a narrow duplex frequency gap, (the frequency difference between the highest transmission frequency and the lowest receiver frequency) resulting in a higher IL. Since the receiver sensitivity in the abovementioned bands is comparatively worse, the range of the wireless link is shorter. As a result, the network design becomes more challenging and more expensive, for example more base stations are needed.

Therefore, from a network operators' perspective, a good reference sensitivity level is a relevant figure-of-merit. In the near future, the IL before the Low Noise Amplifier (LNA) stage of an RF receiver is expected to increase due to inter-band carrier aggregation (CA) as more complex front-end module (FEM) designs are required. Furthermore, some of the existing bands will be extended to cover even wider bandwidths and probably with narrower duplex distances (e.g. Band 2+G-block, Uplink: 1910-1915 MHz, Downlink: 1990-1995 MHz). In such cases, additional losses are expected due to diplexer and switch losses, and additional filtering required due to challenging duplex and co-existence scenarios. More generally, there is a need for cost-optimisation, including in relation to filter modules and materials.

The LNA is usually the first amplifying stage in an RF receiver. According to Friis' equation, the LNA sets the minimum noise figure of the receiver. A low LNA noise figure is a crucial parameter determining the reference sensitivity level of the whole transceiver or RF platform. The LNA is also a crucial part for determining the input impedance of the RFIC. Sufficient input matching performance is required because the performance of the RF filter preceding the LNA will degrade if the input of the LNA is not properly matched to a certain input impedance. Since the RF filters preceding the LNA typically have a fixed frequency range, the RFIC inputs will be matched to specific frequencies as well. Depending on the LNA structure, there might be a need to utilize off-chip matching components to set the input matching to the desired level. Depending on the number of RFIC inputs, the count of the external matching components can become high thus being an expensive and bulky solution.

RFIC performance is a crucial factor in determining the radio platform performance. Within the RFIC, it is the LNA which defines the minimum possible noise figure, which in part defines the reference sensitivity level. The sensitivity performance and input matching configurability of RFICs are fixed and this leads to sub-optimal platform design, since there are several levels of customer (for example network operators, Original Equipment Manufacturers (OEMS), etc.) and different mobile device products each of which may have different requirements for the same chipset. Since the cost of individual ICs scales down when the number of units increases, it is not economically wise to design separately optimised ICs for different customers and/or products.

From the above it can be seen that there are a number of different design factors to be considered when designing an RFIC, and that accommodating some or all of these factors simultaneously can prove difficult. There is therefore a need to enhance RFIC design by providing design adaptivity including improved ways of accommodating various design factors.

SUMMARY

In accordance with first embodiments, there is a configurable radio-frequency integrated circuit (RFIC) comprising one or more configurable low noise amplifier circuits, each of the one or more configurable low noise amplifier circuits being configurable between:

an internal input impedance matching topology in which the respective low noise amplifier circuit comprises one or more internal input impedance matching components adapted to match the input impedance of the respective low noise amplifier to a given input, the one or more internal input impedance matching components being located internally to the respective low noise amplifier circuit; and a topology different from the internal input impedance matching topology.

In accordance with second embodiments, there is a method of configuring a configurable RFIC comprising one or more configurable low noise amplifier circuits, the method comprising applying one of:

a first set of one or more control signals to at least one of the one or more circuits to configure the at least one circuit in an internal input impedance matching topology in which the respective low noise amplifier circuit comprises one or more internal input impedance matching components adapted to match the input impedance of the respective low noise amplifier to a given input, the one or more internal input impedance matching components being located internally to the respective low noise amplifier circuit; or a second set of one or more control signals to at least one of the one or more circuits to configure the at least one circuit in a different topology in which the respective low noise amplifier circuit does not comprise the one or more internal input impedance matching components.

In accordance with third embodiments, there is a method of manufacturing a configurable RFIC according to the first embodiments.

In accordance with fourth embodiments, there is an RF module comprising one or more RF front end modules coupled to one or more configurable RFICs according to the first embodiments.

In accordance with fifth embodiments, there is a chipset comprising one or more configurable RFICs according to the first embodiments.

In accordance with sixth embodiments, there is a device comprising one or more configurable RFICs according to the first embodiments. The device may for example comprise a mobile/cellular telephone.

Further features and advantages will become apparent from the following description of preferred embodiments, given by way of example only, which is made with reference to the accompanying drawings.

DETAILED DESCRIPTION

Figure 1:
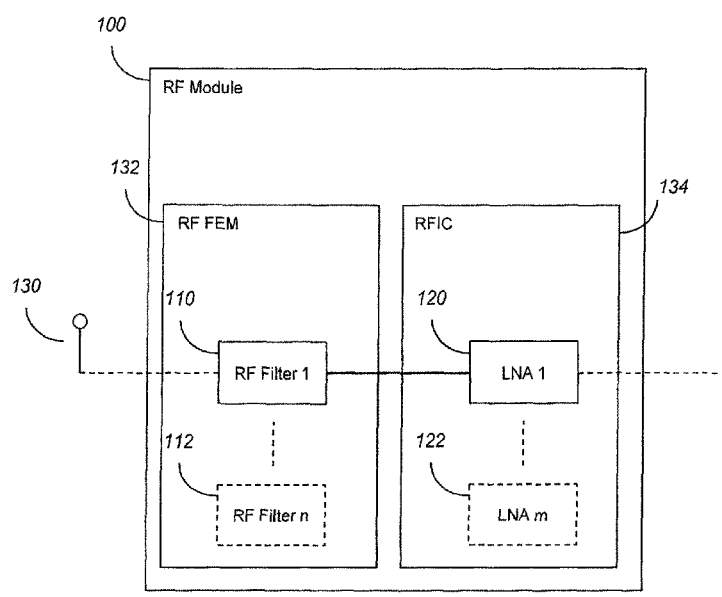
FIG. 1 illustrates an exemplary receiver comprising an RF module and an antenna according to the prior art.

Receivers typically include one or more radio frequency (RF) filters located between the antenna and the LNA(s) that form the first amplifying stage of the receiver. FIG. 1 illustrates an exemplary receiver comprising an RF module 100 and antenna 130. RF module 100 comprises an RF Front End Module 132 which in turn includes one or more (up to a total of n) RF filters 110-112 that filter radio frequency signals gathered by antenna 130. RF module 100 also comprises an RFIC 134 which in turn comprises one or more (up to a total of m) LNAs 120-122 that amplify the filtered signals generated by the RF filters 110-112.

Figure 2:
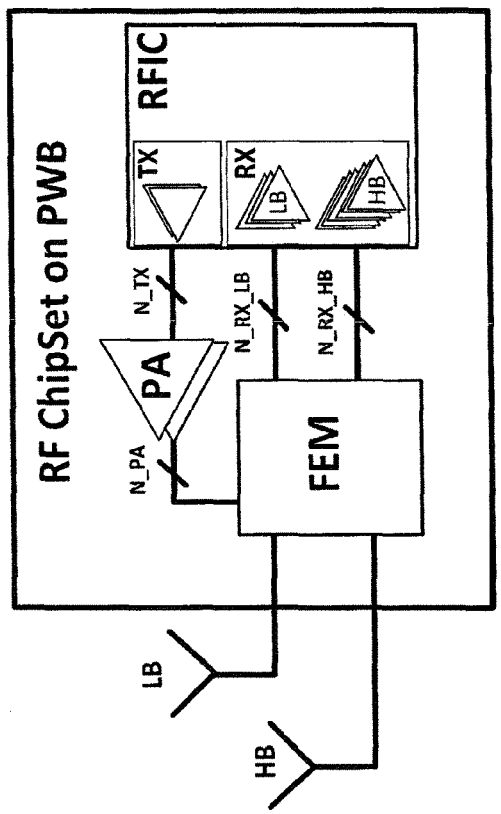
FIG. 2 illustrates an RF chipset on a PWB for a receiver according to the prior art.

FIG. 2 illustrates an RF chipset on a PWB for a receiver. The receiver includes a high-band (HB) antenna and a low-band (LB) antenna connected to an RF front end module (FEM). The RF FEM connects to one or more power amplifier modules (PA) and an RFIC. The PA modules may provide more functionality other than amplification functionality. The RFIC comprises a transmitter (TX) comprising one or more amplifiers and a receiver (RX) comprising one or more LB LNAs and one or more HB LNAs. HB may for example comprise Bands I, II, III, IV, VII, IX, XI, and PCS and DCS. LB may for example comprise Bands V, VI, VIII, XII, XIII, and XIV; and GSM850 and EGSM900.

Figure 3:
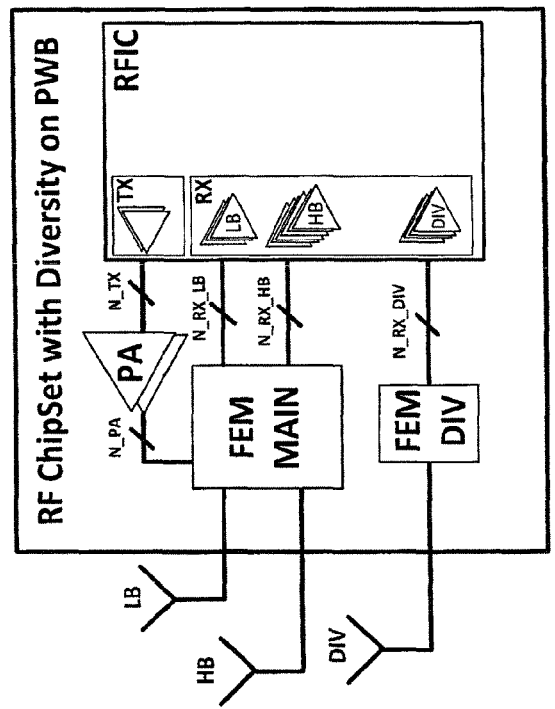
FIG. 3 illustrates an RF chipset on a PWB for a receiver according to the prior art.

FIG. 3 illustrates an RF chipset on a PWB for a receiver. The receiver includes a HB antenna and a LB antenna connected to a main RF FEM. The receiver also includes a diversity (DIV) antenna connected to a DIV FEM. The RF FEMs connect to one or more PAs and an RFIC. The RFIC comprises a TX comprising one or more amplifiers and a RX comprising one or more LB LNAs, one or more HB LNAs and one or more DIV LNAs. The DIV antenna is an additional antenna which is included to improve the reception quality and reliability of the RF receiver link, for example as used in HSDPA and LTE environments.

State of the art RFICs support several different frequency bands. Since the RF filters between the antenna and RFIC typically are optimised for a fixed and narrow frequency range, the RFIC inputs are matched to specific frequencies. Therefore, RFICs contain several inputs dedicated to different frequency areas. In addition, in High Speed Downlink Packet Access (HSDPA) and LTE, for example, there is a need for a diversity (DIV) receiver. Therefore, the number of RF inputs supported within RFICs increases further, particularly when there is a need for a DIV receiver.

The LNA is usually the first block in an RFIC receiver. Depending on the LNA topology, the input matching can be passive and/or active consisting of internal on-chip components or input matching can be achieved with external components placed on a PWB. In general, on-chip components have a poorer quality factor than external components. However, external components should be avoided where possible since the size of the application board and cost should be minimized. The external component count tends to be higher in multi-band and multi-mode transceivers covering several frequency bands. In addition, the need for a diversity receiver in cellular HSDPA and LTE, for example, can increase the number of external matching components required on an application board.

Taking into account the receiver performance, the matching network consisting of external components usually gives some passive voltage gain prior to LNA thus decreasing the noise contribution of the LNA input transistors, and therefore, decreases the overall noise figure of the receiver. This means, in general, that LNA topologies containing external matching components can achieve better noise figure compared to LNAs with internal matching. In addition, the selectivity of the LNA can be improved with passive matching components. For example, the effect of the transmitter (TX) in Frequency Division Duplexing (FDD) systems can be suppressed. In addition, with improved selectivity, desensitization in multi-radio environment can be mitigated. Due to limited attenuation against other radio communications systems and due to 3rd harmonic components in local oscillator signals used in down-conversion, desensitization can result when the receiver down-converts unwanted signals from the frequency which is three times the wanted signal frequency, for example.

Therefore, a clear performance versus cost (Bill-Of materials, including extra PWB/die area and external components), current consumption (battery lifetime), and size trade-off is encountered. However, in current state-of-the-art transceivers, the LNA and RFIC topology is fixed.

Embodiments described herein relate to RFICs that have the capability to be adaptively modified thus avoiding non-optimal and inflexible design. Such configurable RFICs provide performance-optimized and cost-effective RF platforms serving different kinds of needs.

Embodiments comprise a configurable RFIC comprising one or more configurable low noise amplifier circuits. Each of the one or more configurable low noise amplifier circuits is configurable between an internal input impedance matching topology and a different topology.

In the internal input impedance matching topology, a low noise amplifier circuit comprises one or more internal input impedance matching components adapted to match the input impedance of the respective low noise amplifier to a given input. The one or more internal input impedance matching components are located internally to the respective low noise amplifier circuit.

In embodiments, in the different topology, a respective low noise amplifier circuit does not comprise at least one of the one or more internal input impedance matching components.

In embodiments, in the different topology, a respective low noise amplifier circuit does not comprise any of the one or more internal input impedance matching components.

In the different topology, the low noise amplifier circuit does not have the input impedance matching capability of the internal input impedance matching topology, so one or more components located externally to the low noise amplifier circuit are required for input impedance matching. In the embodiments described below in relation to FIGS. 4 to 10, the different topology is referred to as an external input impedance matching topology, i.e. a topology which requires one or more external components for input impedance matching.

In the external input impedance matching topology, an LNA has a better noise figure thus leading to better reference sensitivity level on the platform level. However, the cost is higher due to the requirement for external matching components which leads to an increase in PWB area.

In the internal input impedance matching topology, no external matching components are required but the LNA noise performance is up to 1 dB worse compared to an externally matched LNA of the external input impedance matching topology. Depending on the IL due to RF filter/FEM or limited antenna performance at lower RF frequencies, part of the link loss, can be compensated for by use of the abovementioned configurable RFIC. If a customer notices that there is no need to improve the sensitivity performance at any band, then the cheapest solution can be offered. In embodiments, since the number of assembled components on the PWB can be optimised, devices with high yield and high reliability can be offered.

Several embodiments are now described in relation to FIGS. 4 to 10. In these embodiments, an input connection of an RFIC interface from an RF band output of a FEM to a configurable LNA configured to the internal input impedance matching topology, i.e. which utilises internal impedance matching, is depicted as an empty triangle. An input connection of an RFIC interface from an RF band output of a FEM to a configurable LNA configured to the external input impedance matching topology, i.e. which utilises external impedance matching is depicted as a, shaded (or 'filled') triangle.

If an LNA is configured to the internal input impedance matching topology then its input connection (or 'port' or 'pin') in the RFIC interface can be connected directly to the appropriate RF band output of the FEM.

If an LNA is configured to the external input impedance matching topology then its input connection in the RFIC interface will be connected to the appropriate RF band output of the FEM via one or more external matching components.

Figure 4:
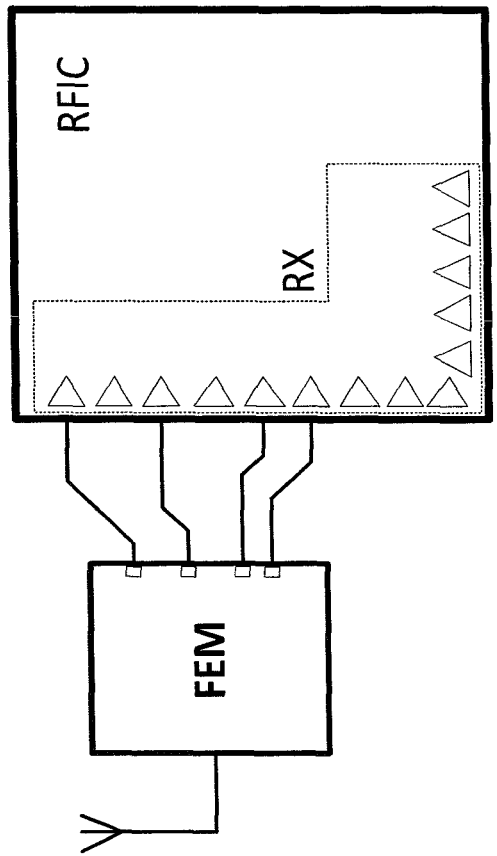
FIG. 4 illustrates an RF chipset on a PWB for a receiver comprising a configurable RFIC according to embodiments.

FIG. 4 illustrates an RF chipset on a PWB for a receiver comprising a configurable RFIC according to embodiments. The embodiments of FIG. 4 depict an ultra low-cost scenario with a single receiver (RX) branch from a main FEM to a configurable RFIC. The configurable RFIC comprises an interface which is arranged to connect one or more configurable LNAs to the main FEM. The interface comprises several input connections each of which connect an input of a configurable LNA to an RF band output of the main FEM. Here, no external impedance matching components are utilised and all LNAs within the RFIC are configured to the internal input impedance matching topology where input matching is realised internally to each LNA circuit.

Figure 5:
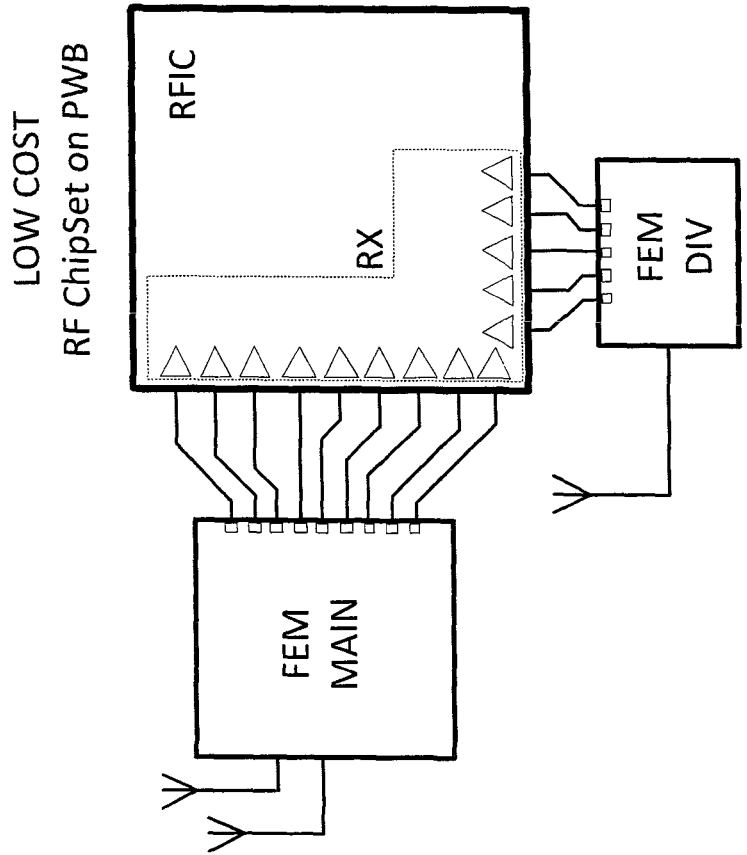
FIG. 5 illustrates an RF chipset on a PWB for a receiver comprising a configurable RFIC according to embodiments.

FIG. 5 illustrates an RF chipset on a PWB for a receiver comprising a configurable RFIC according to embodiments. The embodiments of FIG. 5 depict a low-cost scenario with a main RX branch from a main FEM to a configurable RFIC and also a DIV RX branch from a DIV FEM to the same configurable RFIC.

The configurable RFIC of embodiments of FIG. 5 comprises a first interface which is arranged to connect one or more configurable LNAs to the main FEM. The first interface comprises several input connections each of which connect the input of a configurable LNA to an RF band output of the main FEM. The configurable RFIC also comprises a second interface which is arranged to connect one or more configurable LNAs to the DIV FEM. The second interface comprises several input connections each of which connect the input of a configurable LNA to an RF band output of the DIV FEM. Here, no external impedance matching components are utilised and all LNAs within the RFIC are configured to the internal input impedance matching topology where input matching is realised internally to each LNA circuit.

In both FIGS. 4 and 5, since the number of assembled components on the PWB is relatively small, the configuration can offer high yield and high reliability devices for certain customers. This could involve, for example, products where high temperature variation is encountered producing mechanical stress, where condensation water can damage electronic components/devices and cause corrosion, or where soldering might get corrupted much earlier than anticipated thus shortening product lifetime. Furthermore, machine-to-machine (M2M) devices could benefit from such ultra-low cost RF performance without a diversity branch as per FIG. 4, for example as envisioned for LTE device class 0.

Similarly to the configurable RFIC of embodiments of FIG. 5 described above, the configurable RFICs of embodiments of FIGS. 6 to 10 described below also comprise first and second interfaces which are arranged to connect the inputs of one or more configurable LNAs to the outputs of RF bands of the main and DIV FEMs respectively.

Figure 6:
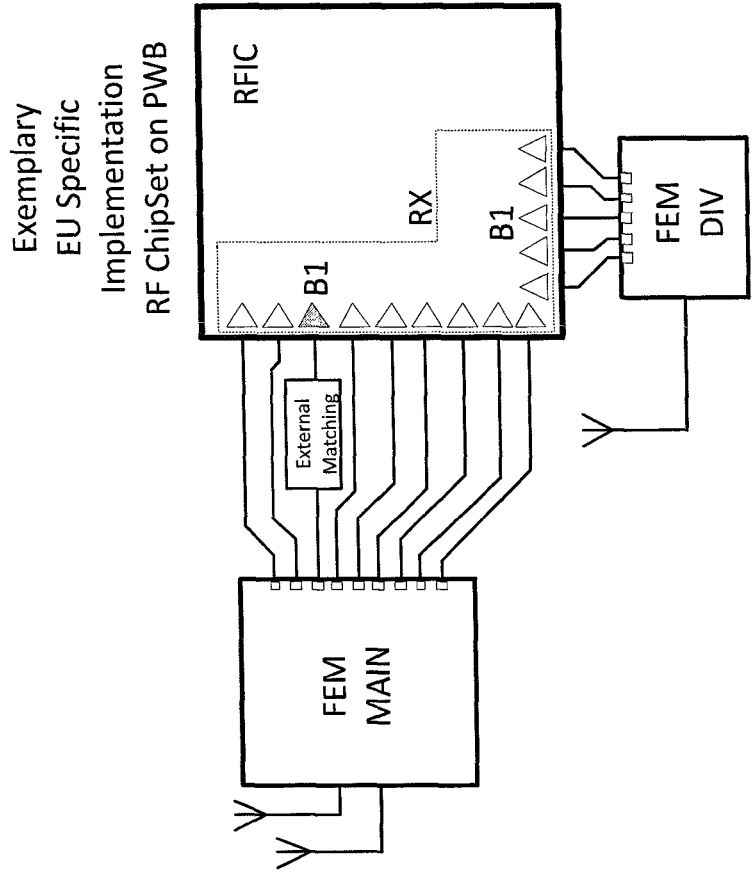
FIG. 6 illustrates an RF chipset on a PWB for a receiver comprising a configurable RFIC according to embodiments.

FIG. 6 illustrates an RF chipset on a PWB for a receiver comprising a configurable RFIC according to embodiments. The embodiments of FIG. 6 depict a scenario where a European network operator wishes to boost the sensitivity of RF Band 1.

The configurable LNA which is connected to the Band 1 RF output of the main FEM is configured to the external input impedance matching topology where the noise performance, and therefore, sensitivity of the main RX is improved using external input impedance matching components. Additionally, the leakage of the TX of the main receiver branch can be suppressed with such external matching.

In the diversity branch, however, there is no TX connected to the RF (duplex) filter. Since the main and div receivers operate at the same frequency, but the antennas are physically different and separate from each other, there is a finite isolation, for example 10 to 15 dB, between the two antennas. This means that the effect of the TX is less in the DIV branch than in the main branch since TX leakage is suppressed by the amount of antenna isolation. This means that external matching components are not mandatory in the DIV branch. The configurable LNA which is connected to the Band 1 RF output of the DIV FEM is therefore configured to the internal input impedance matching topology where internal impedance matching components are used to keep component count and cost as low as possible.

In the embodiments of FIG. 6, a configurable LNA connected to the RF Band 1 output of the main FEM is configured to an external input impedance matching topology, whereas a configurable LNA connected to the RF Band 1 output of the DIV FEM is configured to an internal input impedance matching topology. This means that on the PWB, one or more external matching components will be connected in-between the Band 1 RF output of the main FEM and the input of the appropriate configurable LNA in the RFIC's main interface, whereas the Band 1 RF output of the DIV FEM is connected directly to the input of the appropriate configurable LNA in the RFIC's DIV interface.

Figure 7:
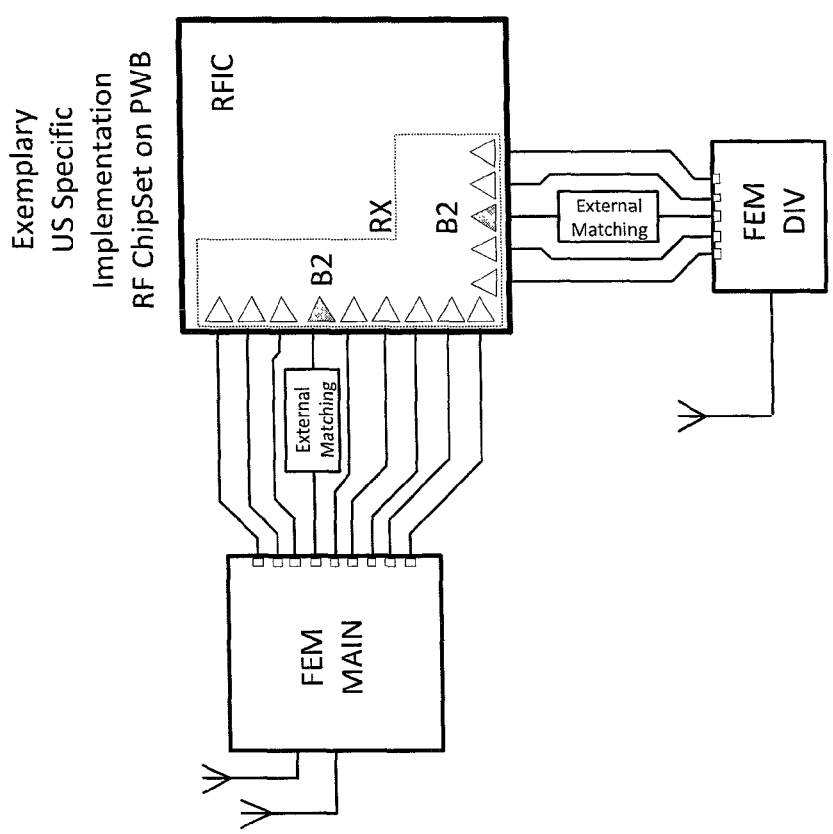
FIG. 7 illustrates an RF chipset on a PWB for a receiver comprising a configurable RFIC according to embodiments.

FIG. 7 illustrates an RF chipset on a PWB for a receiver comprising a configurable RFIC according to embodiments. The embodiments of FIG. 7 depict a scenario where a US network operator wants to compensate the insertion losses due to the FEM at RF Band 2.

The configurable LNA which is connected to the Band 2 RF output of the main FEM is configured to the external input impedance matching topology where external matching components are required. The configurable LNA which is connected to the Band 2 RF output of the DIV FEM is also configured to the external input impedance matching topology where external matching components are required. This means that on the PWB, one or more external matching components will be connected in-between the Band 2 RF output of the main FEM and the input of the appropriate configurable LNA in the RFIC's main interface. Similarly, one or more external matching components will be connected in-between the Band 2 RF output of the DIV FEM and the input of the appropriate configurable LNA in the RFIC's DIV interface.

In this particular example, external matching components are used both in the main and diversity receivers. In the near future, RF Band 2 will extend to also cover G-block (Uplink frequencies: 1910-1915 MHz, Downlink frequencies: 1990-1995 MHz), thus forming even more challenging filtering scenario for duplexers. As a result, even higher insertion losses are expected which necessitates the use of high-performance configurations as per the embodiments of FIG. 7.

Figure 8:
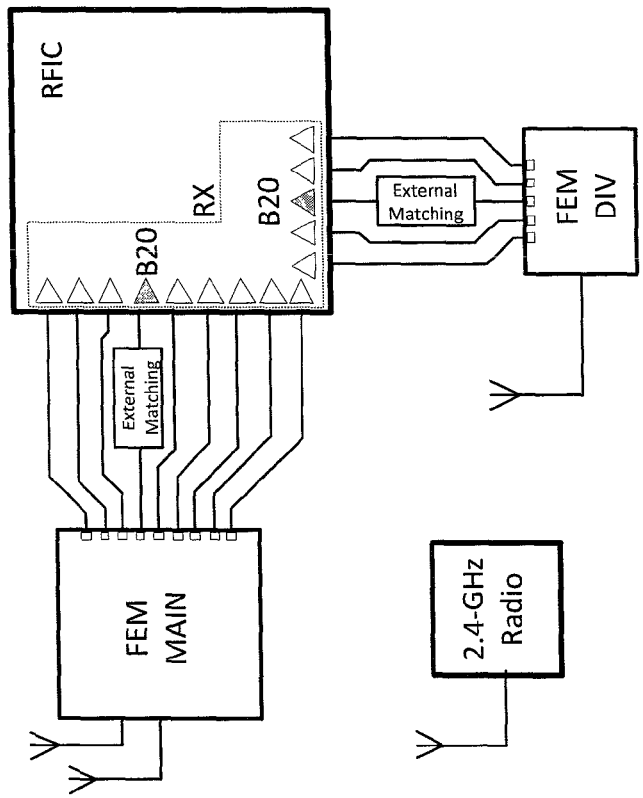
FIG. 8 illustrates an RF chipset on a PWB for a receiver comprising a configurable RFIC according to embodiments.

FIG. 8 illustrates an RF chipset on a PWB for a receiver comprising a configurable RFIC according to embodiments. The embodiments of FIG. 8 depict a scenario where a network operator utilising RF Band 20 (791 MHz-821 MHz) wants to improve the sensitivity level. Here, the third harmonic of the RX band (2373-2463 MHz) partially overlaps with 2.4-GHz industrial, scientific and medical (ISM) band. Therefore, to mitigate the down-conversion from the third harmonic and to minimize the desensitization of the wanted channel, Interference-to-Signal-Ratio (ISR) performance can be improved with better selectivity provided by external input impedance matching components.

The configurable LNA which is connected to the Band 20 RF output of the main FEM is configured to the external input impedance matching topology where external matching components are required. The configurable LNA which is connected to the Band 20 RF output of the DIV FEM is also configured to the external input impedance matching topology where external matching components are required. This means that on the PWB, one or more external matching components will be connected in-between the Band 20 RF output of the main FEM and the input of the appropriate configurable LNA in the RFIC's main interface. Similarly, one or more external matching components will be connected in-between the Band 20 RF output of the DIV FEM and the input of the appropriate configurable LNA in the RFIC's DIV interface.

A similar configuration to the embodiments of FIG. 8 could be utilized to suppress the coexistence of 5-GHz WLAN and cellular bands operating in the vicinity of 1.7-1.9 GHz.

Figure 9:
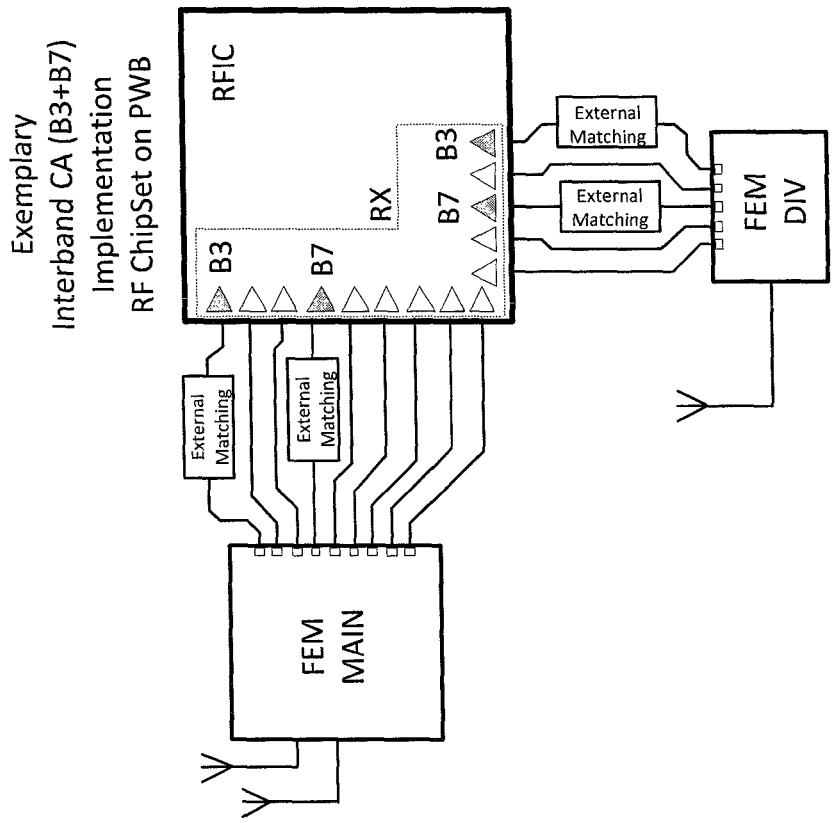
FIG. 9 illustrates an RF chipset on a PWB for a receiver comprising a configurable RFIC according to embodiments.

FIG. 9 illustrates an RF chipset on a PWB for a receiver comprising a configurable RFIC according to embodiments. The embodiments of FIG. 9 depict a Carrier Aggregation (CA) scenario where additional loss due to complex FEM and filtering setup is partially compensated for with external matching components.

Both the main FEM and DIV FEM function using both RF band 3 and RF band 7 with the configurable RFIC processing signals from both RF band 3 and RF band 7 from each of the main FEM and DIV FEM accordingly.

The configurable LNA which is connected to the Band 3 RF output of the main FEM is configured to the external input impedance matching topology where external matching components are required. The configurable LNA which is connected to the Band 7 RF output of the main FEM is also configured to the external input impedance matching topology where external matching components are required.

The configurable LNA which is connected to the Band 3 RF output of the DIV FEM is configured to the external input impedance matching topology where external matching components are required. The configurable LNA which is connected to the Band 7 RF output of the DIV FEM is also configured to the external input impedance matching topology where external matching components are required This means that on the PWB, one or more external matching components will be connected in-between the Band 3 RF output of the main FEM and the input of the appropriate configurable LNA in the RFIC's main interface. Further, one or more external matching components will be connected in-between the Band 7 RF output of the main FEM and the input of the appropriate configurable LNA in the RFIC's main interface.

Similarly, on the PWB, one or more external matching components will be connected in-between the Band 3 RF output of the DIV FEM and the input of the appropriate configurable LNA in the RFIC's DIV interface and one or more external matching components will be connected in-between the Band 7 RF output of the DIV FEM and the input of the appropriate configurable LNA in the RFIC's DIV interface.

Figure 10:
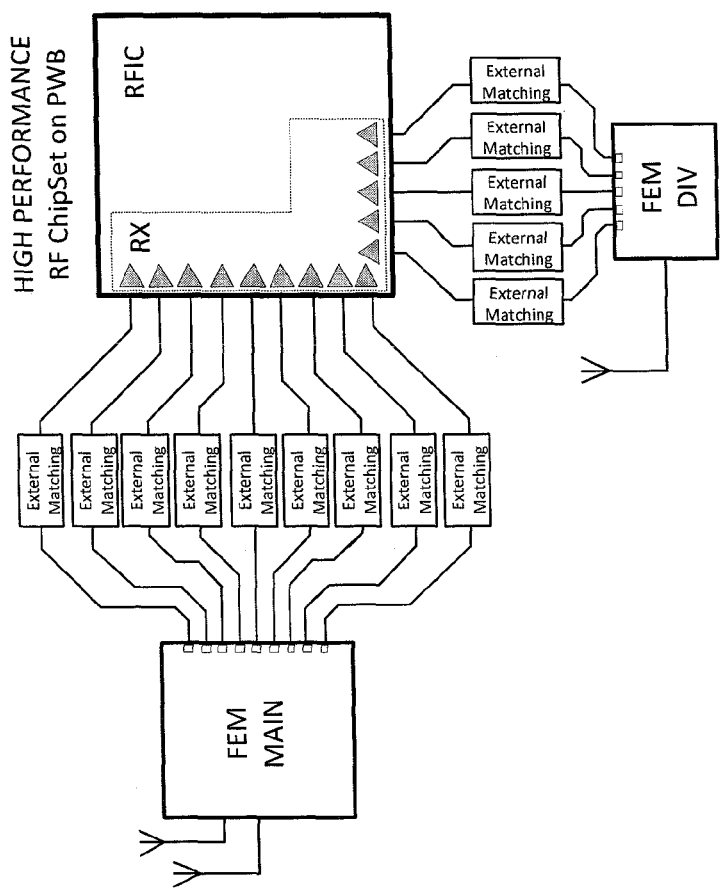
FIG. 10 illustrates an RF chipset on a PWB for a receiver comprising a configurable RFIC according to embodiments.

FIG. 10 illustrates an RF chipset on a PWB for a receiver comprising a configurable RFIC according to embodiments. The embodiments of FIG. 10 depict the most expensive and high-performance scenario where all LNAs within the RFIC are configured to the external input impedance matching topology where input matching is realised using external input matching components.

All configurable LNAs which are connected to outputs of the main FEM, such as RF Band outputs, are configured to the external input impedance matching topology where external matching components are required. Similarly, all configurable LNA which are connected to various outputs of the DIV FEM, such as RF Band outputs, are configured to the external input impedance matching topology where external matching components are required.

This means that on the PWB, one or more external matching components will be connected in-between RF band outputs of the main FEM and the inputs of the appropriate configurable LNAs in the RFIC's main interface. Similarly, one or more external matching components will be connected in-between RF band outputs of the DIV FEM and the inputs of the appropriate configurable LNAs in the RFIC's DIV interface.

A configurable RFIC according to embodiments can be adaptively configured according to the desire of the customer. Sensitivity can be improved if required at the cost of using external matching components and increasing PWB area. Improved selectivity can be achieved to suppress TX leakage or other radio systems (e.g. 2.4-GHz or 5-GHz connectivity radios). Since the configurable LNAs within the RFIC can be matched without external input impedance matching components, the configurable RFIC embodiments provide a cost-efficient solution with high quality and reliability. Thus, embodiments provide a capability to trade-off between price and performance.

All the embodiments illustrated in FIGS. 4 to 10 can be implemented using a single RFIC which can be configured to the different setups depending on the preferred use case. As a result, a wide variety of chipset configurations from lowest cost to those with high performance options can be covered with the same IC design. This leads to more optimal engineering and marketing solutions since several mobile device products with different requirements can be covered with the same RFIC.

In embodiments, each of the one or more configurable low noise amplifier circuits comprises a switching arrangement. Each of the circuits is configurable between one of an internal input impedance matching topology and a different topology via the respective switching arrangement. The different topology may comprise a topology where one or more external components are required for input impedance matching.

The switching arrangement may comprise one or more topology switching functions (or means) which may for example comprise switching transistors and/or bias voltage switching functions (or means). Switching arrangements for switching between a number of pairs of different internal input impedance matching and external input impedance matching topologies are described below in relation to FIGS. 11 to 20.

A number of different configurable LNA circuits could be employed in the configurable RFIC embodiments described herein.

In some embodiments, the internal input impedance matching topology comprises a common-gate low noise amplifier topology and the different topology comprises an inductively degenerated low noise amplifier topology. Example configurable LNAs for such embodiments are described below in relation to FIGS. 11 to 13.

In some embodiments, the internal input impedance matching topology comprises a resistive feedback low noise amplifier topology and the different topology comprises an inductively degenerated low noise amplifier topology. Example configurable LNAs for such embodiments are described below in relation to FIGS. 11, 14 and 15.

In some embodiments, the different topology comprises an inductively degenerated low noise amplifier topology and the internal input impedance matching topology comprises an impedance matching stage coupled to an input of the configurable low noise amplifier circuit, the output of the impedance matching stage providing an input bias voltage for the impedance matching stage, and a feedback stage coupled to an output of the impedance matching stage and a voltage source, the feedback stage providing a compensated operating voltage for the impedance matching stage. The latter topology here is referred to below as a signal reusing topology. Example configurable LNAs for such embodiments are described below in relation to FIGS. 11 and 16 to 20.

In embodiments, each of the one or more configurable low noise amplifier circuits comprises a common output terminal at which an output signal of the respective configurable low noise amplifier circuit is provided when configured in either the internal input impedance matching topology or the different topology.

Figure 13:
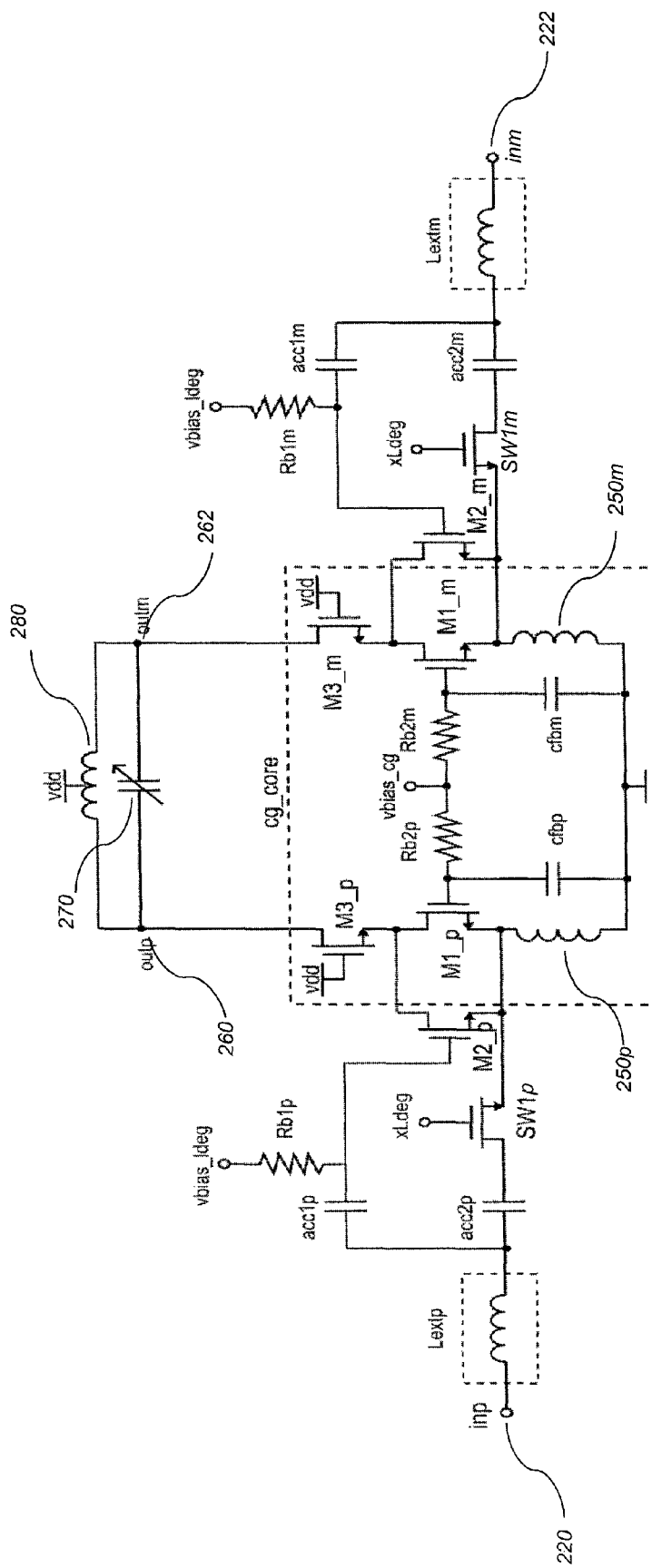
FIG. 13 is a circuit diagram of a configurable LNA according to embodiments.

For example, in the case of a non-differential amplifier such as only the positive side of the configurable low noise amplifier of FIG. 13 being employed, the output of the circuit when configured in the first topology is produced at output terminal 260 and the output of the circuit when configured in the second topology is also produced at output terminal 260. Such re-use of a single output terminal for both topologies provides a lower cost solution both for the configurable LNA itself and other components connecting to it than a solution requiring multiple output terminals. Similarly, a single, common, pair of output terminals can be employed for the case of a differential amplifier, rather than multiple pairs of output terminals for different configurations. Such common output terminal features are especially beneficial in configurable RFIC embodiments described herein wherein multiple configurable LNAs are present.

Several LNA structures are known, each of these having certain benefits and drawbacks regarding their noise performance, overall cost, and input matching capabilities.

A known LNA topology is the inductively degenerated LNA topology, a detailed analysis of which has been given in, for example, in D. K. Shaeffer and T. H. Lee, "A 1.5-V, 1.5-GHz CMOS low noise amplifier," IEEE J. of Solid-State Circuits, vol. 32, no. 5, May 1997, pp. 745-759.

Figure 11:
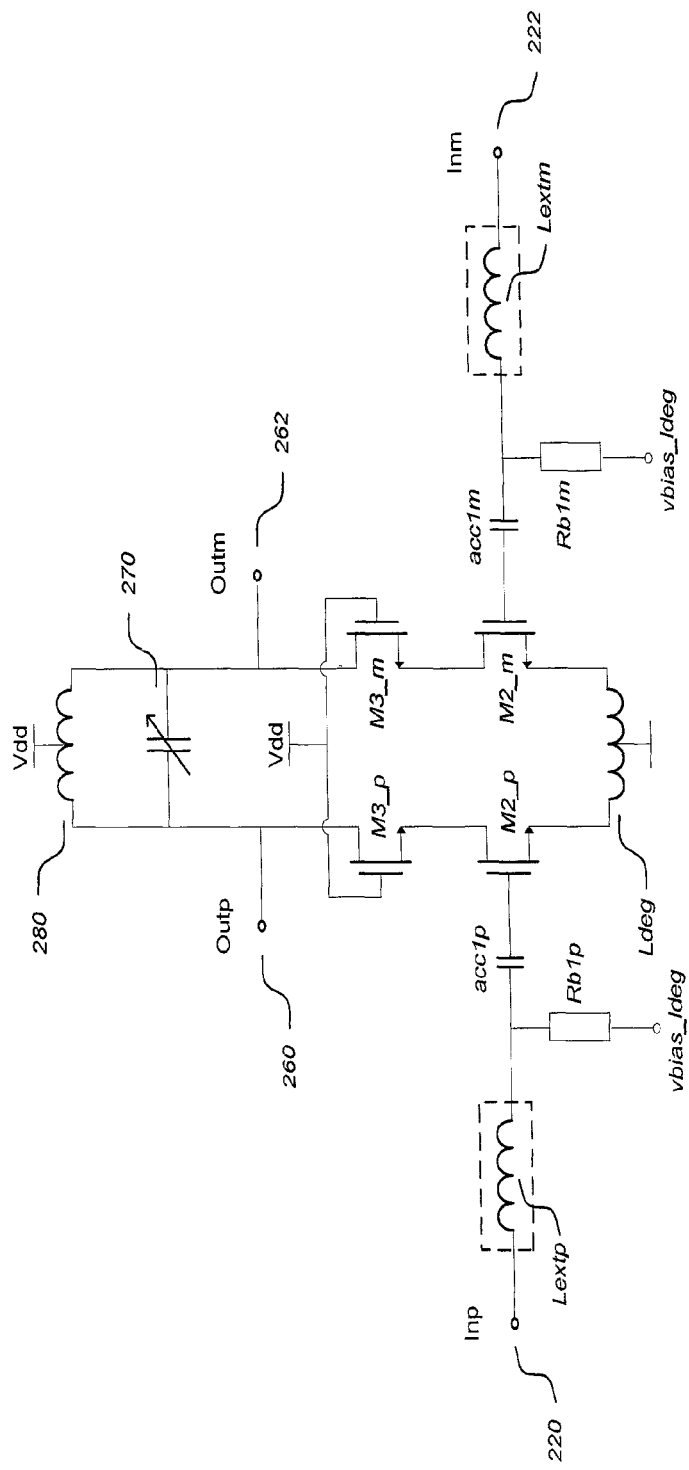
FIG. 11 is a circuit diagram of an inductively degenerated LNA according to embodiments.

An exemplary inductively degenerated LNA circuit is depicted in FIG. 11. The LNA of FIG. 11 is a differential amplifier, where transistors M2_p and M3_p form the positive or 'plus' side of the differential amplifier, and transistors M2_m and M3_m form the negative or 'minus' side of the differential amplifier. The plus and minus sides of the differential amplifier are each arranged in a cascode configuration, where transistors M2_p and M2_m, each arranged in a common source configuration, form the input (or 'gain') transistors of the plus and minus sides, respectively, and transistors M3_p and M3_m form the cascode transistors (or 'current cascodes') of the plus and minus sides, respectively. In this case, each of transistors M2_p, M2_m, M3_p, M3_m is an enhancement mode n-channel metal-oxide-semiconductor field-effect transistor (MOSFET) (also referred to as 'NMOS').

The differential amplifier amplifies the difference between the two input signals inp, inm applied to its input terminals 220 and 222, where the signal applied to input terminal 222 is a signal having the same magnitude as the signal applied to input terminal 220 but being 180 degrees out of phase with that signal (i.e. the signals have opposite phase). The differential amplifier can be capable of rejecting signal components common to both its input signals whilst amplifying the difference between the two signals. The degree to which the differential amplifier rejects signal components common to both its input signals whilst amplifying the difference between the two signals can be measured by the Common-Mode Rejection Ratio (CMRR) metric.

The gate terminal of input transistor M2_p on the plus side of the amplifier is connected to a bias voltage source vbias_1 deg via a first bias resistor Rb1p and decoupling capacitor acc1p. The gate terminal of input transistor M2_p is also connected to an external matching component Lextp via decoupling capacitor acc1p. Input terminal 220 is connected to external matching component Lextp. External matching component Lextp is located on a separate circuit or device to the circuit containing the LNA of FIG. 11, i.e. matching component Lextp is 'off-chip' (denoted by dashed surrounding box in FIG. 11). In this case, matching component Lextp is an inductor.

Similarly on the minus side of the amplifier, the gate terminal of input transistor M2_m is connected to bias voltage source vbias_1 deg via a second bias resistor Rb1m and decoupling capacitor acc1m. The gate terminal of input transistor M2_m is also connected to an external matching component Lextm via decoupling capacitor acc1m. Input terminal 222 is connected to external matching component Lextm. Again, matching component Lextm is located off-chip, and in this case is an inductor.

The gate terminals of input transistors M2_p and M2_m thus each form an input terminal of their respective input transistor. The source and drain terminals of input transistors M2_p and M2_m therefore form output terminals of the input transistors.

The source terminal of each of the two input transistors M2_p and M2_m is connected to a different respective terminal of an inductor Ldeg. Inductor Ldeg is a centre-tap differential inductor device with mutual coupling. Inductor Ldeg provides inductive degeneration of the source terminals of the two gain transistors M2_p and M2_m. The centre-tap terminal of inductor Ldeg is connected to ground.

The drain terminal of gain transistor M2_p on the plus side of the differential amplifier is connected to the source terminal of cascode transistor M3_p. Similarly, the drain terminal of gain transistor M2_m on the minus side of the differential amplifier is connected to the source terminal of cascode transistor M3_m.

The gate terminals of cascode transistors M3_p and M3_m are both connected to the circuit voltage supply Vdd (a DC voltage). Note that a gate terminal DC voltage can be set to a level other than Vdd, such that the drain voltages of gain transistors M2_p,m can be set to a desired level in order to increase the available voltage swing at the drain terminals of cascode transistors M3_p,m.

The drain terminals of cascode transistors M3_p and M3_m are connected to output terminals 260 and 262 respectively, where 260 is the output terminal of the plus side of the differential amplifier at which output signal outp is produced, and 262 is the output terminal of the minus side of the differential amplifier at which output signal outm is produced. The drain terminals of cascode transistors M3_p and M3_m are also each connected to the voltage supply Vdd via a configurable load; in this case the configurable load comprises an inductor 280 and variable capacitor 270 connected in parallel. Inductor 280 is a centre-tap differential inductor device and its centre-tap terminal is connected to voltage supply Vdd. The output terminals 260 and 262 of the LNA of FIG. 11 are thus connected to the configurable load.

The noise performance of the LNA topology depicted in FIG. 11 is typically dominated by the noise performance of input transistors M2_p and M2_m. The noise performance can be improved by optimizing the input matching network (for example including gain transistors M2_p and M2_m and external matching components Lextp and Lextm). In this topology, the input matching network preceding the input transistors provides passive voltage gain which can be measured as a ratio of the voltage swing observed at the gate to source terminal junction of the corresponding input transistor, e.g. M2_p, and the voltage swing at the LNA input. A high value for this ratio, known in this context as the Q-value of the input matching network, is beneficial in reducing the drain current noise of input transistor M2_p, but it increases the induced gate current noise of the input transistor. However, the inductively degenerated LNA requires several off-chip external matching components Lextp and Lextm, and thus tends to be relatively expensive.

A second known LNA topology is the common-gate LNA, a detailed analysis of which has been given in a journal publication entitled "A 4.5-mW 900-MHz CMOS Receiver for Wireless Paging," by Hooman Darabi and Asad A. Abidi published in IEEE Journal of Solid-State Circuits, Vol. 35, No. 8, August 2000.

Figure 12:
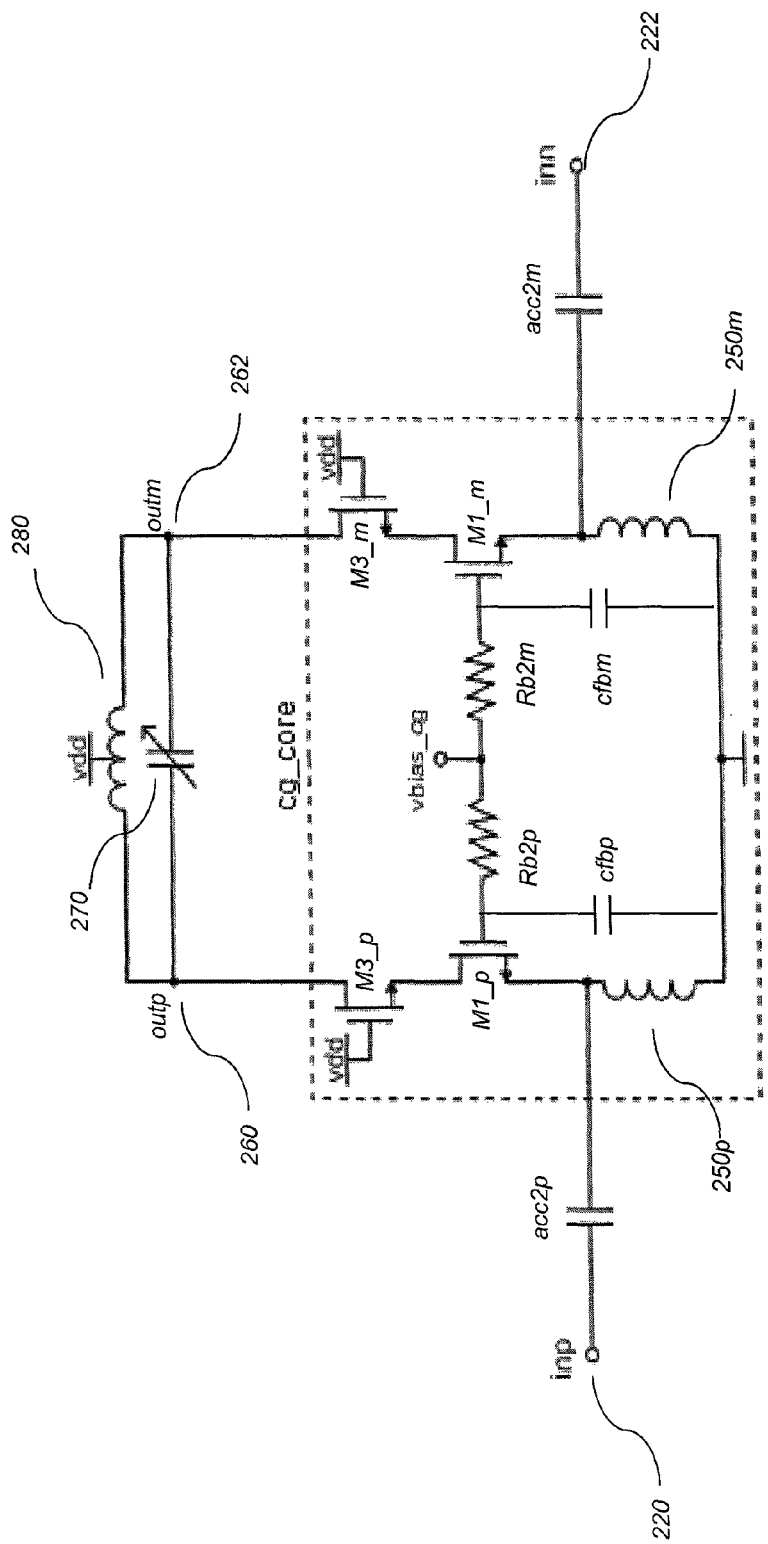
FIG. 12 is a circuit diagram of a common-gate LNA according to embodiments.

An exemplary common-gate LNA circuit is depicted in FIG. 12. As with the inductively degenerated LNA of FIG. 11, the LNA of FIG. 12 is a differential amplifier, where transistors M1_p and M3_p form the positive or 'plus' side of the differential amplifier, and transistors M1_m and M3_m form the negative or 'minus' side of the differential amplifier.

The common-gate LNA of FIG. 12 includes a common-gate LNA stage (labelled cg_core in FIG. 12) which includes input transistors M1_p,m which are provided with appropriate bias voltages from voltage source vbias_cg via bias resistors Rb2p,m. The common-gate LNA stage also includes cascode transistors M3_p,m and inductors 250p,m. The common-gate LNA stage of FIG. 12 also contains a capacitor cfbp,m between the gate of each input transistor and their output source terminals.

No external matching components Lextp and Lextm are provided in the common-gate LNA of FIG. 12. Input transistors M1_p and M1_m are thus directly connected to the input terminals 220, 222 respectively, via decoupling capacitors acc2p and acc2m.

Rather than requiring external matching components in order to match the impedance to which input terminals 220 and 222 are connected (where the impedance to be matched to is for example the output impedance of an RF filter preceding the LNA), the common-gate LNA of FIG. 12 is capable of matching the impedance connected to input terminals 220 and 222 internally within the LNA.

A common-gate LNA such as that depicted in FIG. 12 has a capability for internal input impedance matching because the impedance at the source of an input transistor is inversely proportional to the transconductance $g_m$. Typically, the single-ended termination impedance is 50Ω, and therefore a transconductance of approximately 20 mS is required. A large impedance towards the signal ground is required in order to steer the signal into the source terminal of the input transistors which can be achieved with a current source connected to the respective source nodes. However, such a current source topology is not typically utilised due to associated poor noise performance and stacking of several transistors can lead to technology restrictions. Instead, a better noise performance is achieved by using an inductor 250_p,m at the source node of the input transistors M1_p,m as depicted in FIG. 12.

In the case of perfect impedance matching ($1/g_m=R_S$), the voltage gain of the common-gate low noise amplifier becomes a division of output load versus the source impedance, i.e. $Z_L/R_S$. Such an assumption is valid if the drain-to-source resistance $r_{ds}$ of the input transistors is much larger than the load resistance at the respective drain terminals. Since the voltage gain of the common-gate low noise amplifier is limited to load/source impedance ratios, it can be challenging to achieve a high voltage gain figure. Furthermore, the need for a high output impedance also requires special attention to be made to the interface design.

The minimum noise figure of a perfectly matched common-gate LNA typically presented in the prior art is $$NF = 10lg\left(1 + \frac{\gamma}{\alpha}\right) = 10lg\left(\frac{5}{3}\right) = 2.2 \text{ dB}$$

For short-channel devices, the noise parameter γ can be much greater than unity, and α can be much less than unity. In practice, an achievable noise figure tends to be around 3 dB or greater. This means that the noise figure is somewhat higher for a common-gate LNA compared to an inductively degenerated common-source LNA.

In summary, a common-gate LNA can provide wideband matching without external matching components. In addition, a common-gate LNA offers good linearity. Furthermore, if two independent source inductors are used, good input matching is also achieved in common-mode which results in good common-mode linearity as well. Compared to the inductively degenerated LNA of FIG. 11, a common-gate LNA has poorer noise performance and, depending on the application, it can require special attention in relation to interface design.

Embodiments relate to an LNA circuit that can be configured between one of a first topology in which the low noise amplifier circuit comprises a degeneration inductance stage such that the low noise amplifier circuit operates as an inductively degenerated low noise amplifier, and a second topology in which the low noise amplifier circuit comprises a common-gate low noise amplifier stage such that the low noise amplifier circuit operates as a common-gate low noise amplifier. In the first topology, external matching components are used in conjunction with the LNA for input impedance matching purposes. In the second topology, input impedance matching is carried out using components internal to the LNA topology; no external matching components are required in the second topology. Input impedance matching may for example involve matching to the output impedance of an RF filter connected to one or more inputs of the LNA.

An exemplary configurable LNA circuit according to the invention is illustrated in FIG. 13. As with the LNAs of FIGS. 11 and 12, the exemplary LNA of FIG. 13 is a differential amplifier, where transistors M1_p, M2_p and M3_p form the positive or 'plus' side of the differential amplifier, and transistors M1_m, M2_m and M3_m form the negative or 'minus' side of the differential amplifier.

The exemplary configurable LNA circuit of FIG. 13 contains a common-gate LNA stage (labelled cg_core) as per the common-gate LNA stage of the circuit of FIG. 12.

The topology of the configurable LNA of FIG. 13 necessarily contains some similar features to both the inductively degenerated LNA of FIG. 11 and the common-gate LNA of FIG. 12; however, there are several important differences which include the following:

Firstly, the configurable LNA of FIG. 13 contains a switching arrangement for configuring the LNA between one of the first topology and the second topology. The switching arrangement contains a topology switching function, in this case switching transistors SW1p,m connected between an output of the degeneration inductance stage and an input of the configurable LNA. In this case, the source terminals of SW1p,m are connected to the source terminals of the input transistors M1_p,m of the common-gate LNA stage and the drain terminals of SW1p,m are connected to decoupling capacitors acc2p,m. The source terminals of switching transistors SW1p,m are also connected to the source terminals of the input transistors M2_p,m of the inductively degenerated LNA stage. The gate terminals of switching transistors SW1p,m are connected to a configuration control signal terminal, for example as labelled xLdeg in FIG. 13.

Secondly, instead of including both degeneration inductors in each side of the differential amplifier as per the inductively degenerated LNA of FIG. 11 and also inductors at the source of the input transistors M1_p, m in both sides of the differential amplifier as per the common-gate LNA stage of FIG. 12, the configurable LNA of FIG. 13 only comprises inductors 250p,m. Further, the inductor (Ldeg) in FIG. 11 comprises a single centre-tapped inductor, whilst in FIGS. 12 and 13 there are two separate inductors 250p,m. These inductors are shared between the first and second topologies and usefully employed when the configurable LNA is configured in either topology. Such component re-use helps reduce costs and die area.

By applying appropriate configuration control signals to configuration control terminals xLdeg, switching transistors SW1p,m can be switched between an open state, whereby the configurable LNA of FIG. 13 is configured in the first topology, and a closed state, whereby the configurable LNA of FIG. 13 is configured in the second topology.

The configurable LNA can be configured according to the desired use case. Sensitivity can be improved in the first, inductively degenerated configuration if required but at the cost of a requirement for external matching components. However, since in the second, common-gate configuration the configurable LNA can be matched without external input impedance matching components, a cost-efficient solution is provided. The second, common-gate configuration also provides better linearity than the first, inductively degenerated configuration. Thus, embodiments provide the possibility to trade-off between price and performance.

The first and second topologies that the configurable LNA can be configured between using the topology switching functions will now be described in more detail.

When in an open state, a switching transistor provides a high resistance between its drain and source terminals which effectively disconnects (or 'open-circuits') the drain and source terminals. A switching transistor may be placed in the open state by applying an appropriate control signal to the respective configuration control signal terminal such that the voltage between the gate terminal and the source terminal (i.e. the voltage $V_{gs}$) of the switching transistor is less (or approximately less) than the threshold voltage (i.e. the voltage $V_t$) of the switching transistor, i.e. a switching transistor may thus be described as being in cutoff mode. A configuration control signal for configuring a switching transistor into an open state may for example comprise a digital '0' signal (such as a signal comprising a first voltage level).

When in a closed state, a switching transistor provides a low resistance between its drain and source terminals which effectively connects (or 'short-circuits') the drain and source terminals. A switching transistor can be placed in the closed state by applying a configuration control signal to its control signal terminal such that the voltage between the gate terminal and the source terminal (i.e. the voltage $V_{gs}$) of the switching transistors is greater than the threshold voltage (i.e. the voltage $V_t$) of the switching transistor, i.e. a switching transistor may thus be described as being in triode mode. A configuration control signal for configuring a switching transistor into a closed state may for example comprise a digital '1' (such as a signal comprising a second voltage level)

In the first topology, switching transistors SW1p,m are configured to an open state.

The switching arrangement also comprises a first bias voltage switching function adapted to set the bias voltage vbias_1 deg to either a relatively high or a relatively low bias voltage. The configurable low noise amplifier circuit is configurable in the first topology by using the first bias voltage switching function to set the bias voltage vbias_1 deg to a relatively high bias voltage. Applying a relatively high bias voltage to the input transistors M2_p,m of the inductively degenerated LNA stage biases the M2_p,m transistors to an open state. What constitutes a relatively high bias voltage depends on the transistor technology used. Typically, a relatively high bias voltage comprises a voltage of around one third to one half of the supply voltage, although voltages outside this could be employed. In embodiments, the supply voltage is 1.25V and a relatively high bias voltage comprises 450-500 mV.

The switching arrangement also comprises a second bias voltage switching function adapted to set the bias voltage vbias_cg to either a relatively high or a relatively low bias voltage. The configurable low noise amplifier circuit is configurable in the first topology by using the second bias voltage switching function to set the bias voltage vbias_cg to a relatively low bias voltage. Applying a relatively low bias voltage to the input transistors M1_p,m of the common-gate LNA stage biases the M1_p,m transistors in a closed state. A relatively low bias voltage may for example comprise a zero bias voltage.

By configuring switching transistor SW1p,m to an open state and biasing input transistors M1_p,m of the common-gate LNA stage in a closed state, the source terminals of input transistors M2_p,m of the inductively degenerated stage are connected via inductors 250p,m. Inductors 250p,m therefore provide inductive degeneration of the source terminals of input transistors M2_p, as in the inductively degenerated LNA of FIG. 11.

The configurable LNA thus operates as an inductively degenerated LNA when switching transistors SW1p,m are switched to an open state, i.e. when the configurable LNA is configured in the first topology.

Therefore, when configured in the first topology, the configurable LNA does not provide internal input impedance matching, for example matching to the output impedance of a preceding RF filter connected to input terminals 220 and 222. As a result, the input impedance of the configurable LNA of FIG. 13 can be matched, for example to a preceding RF filter, by connecting appropriate external impedance matching components. The external matching components may for example comprise external matching components Lextp and Lextm, which are connected in-between decoupling capacitors acc1p,m and input terminals 220 and 222 respectively.

The first topology of the configurable LNA of FIG. 13 thus provides at least some of the benefits of the inductively degenerated LNA of FIG. 11, including relatively low noise figure, but requires the use of external matching components in order to provide input impedance matching.

In the second topology, switching transistors SW1p,m are configured to a closed state.

The configurable low noise amplifier circuit is configurable in the second topology by using the first bias voltage switching function to set the bias voltage vbias_1 deg to a relatively low bias voltage. Applying a relatively low bias voltage to the input transistors M2_p,m of the inductively degenerated LNA stage biases the M2_p,m transistors to a closed state.

The configurable low noise amplifier circuit is configurable in the second topology by using the second bias voltage switching function to set the bias voltage vbias_cg to a relatively high bias voltage. Applying a relatively high bias voltage to the input transistors M1_p,m of the common-gate LNA stage biases the M1_p,m transistors in an open state.

By configuring switching transistor SW1p,m to a closed state and biasing input transistors M1_p,m of the common-gate LNA stage in an open state, the source terminals of input transistors M1_p,m of the common-gate LNA stage are connected via inductors 250p,m, which are connected to ground. Inductors 250p,m connected to the source terminals of input transistors M1_p,m source are high impedance at the operating frequency and work as the DC-current path to ground for the second topology.

Inductors 250p,m remain in-circuit in both the first topology and the second topology such that embodiments use the area of an expensive (in terms of area) integrated inductor for two different purposes. The same integrated inductor is used as a degeneration inductor in the inductively degenerated topology and as a DC feed inductor in the common-gate LNA topology. The use of a single inductor in both topologies avoids one expensive on-chip component being required for one topology and another expensive on-chip component being required for the other topology.

The configurable LNA of FIG. 13 thus provides an LNA that can be configured according to the desired use case or design requirements.

The LNA can be configured in the first topology if a more sensitive LNA with a better noise figure is required, at the cost of a need for external matching components, e.g. Lextp and Lextm, in order to provide impedance matching for the inputs of the configurable LNA. Alternatively, the LNA can be configured in the second topology in order to provide a more cost effective solution with better linearity.

A further known LNA topology is the resistive feedback (or 'shunt-resistor') LNA, a detailed analysis of which has been given in C.-F. Liao and S.-I. Liu, "A broadband noise-cancelling CMOS LNA for 3.1-10.6-GHz UWB receivers," IEEE Journal of Solid-State Circuits, vol. 42, no. 2, February 2007, pp. 329-339.

Figure 14:
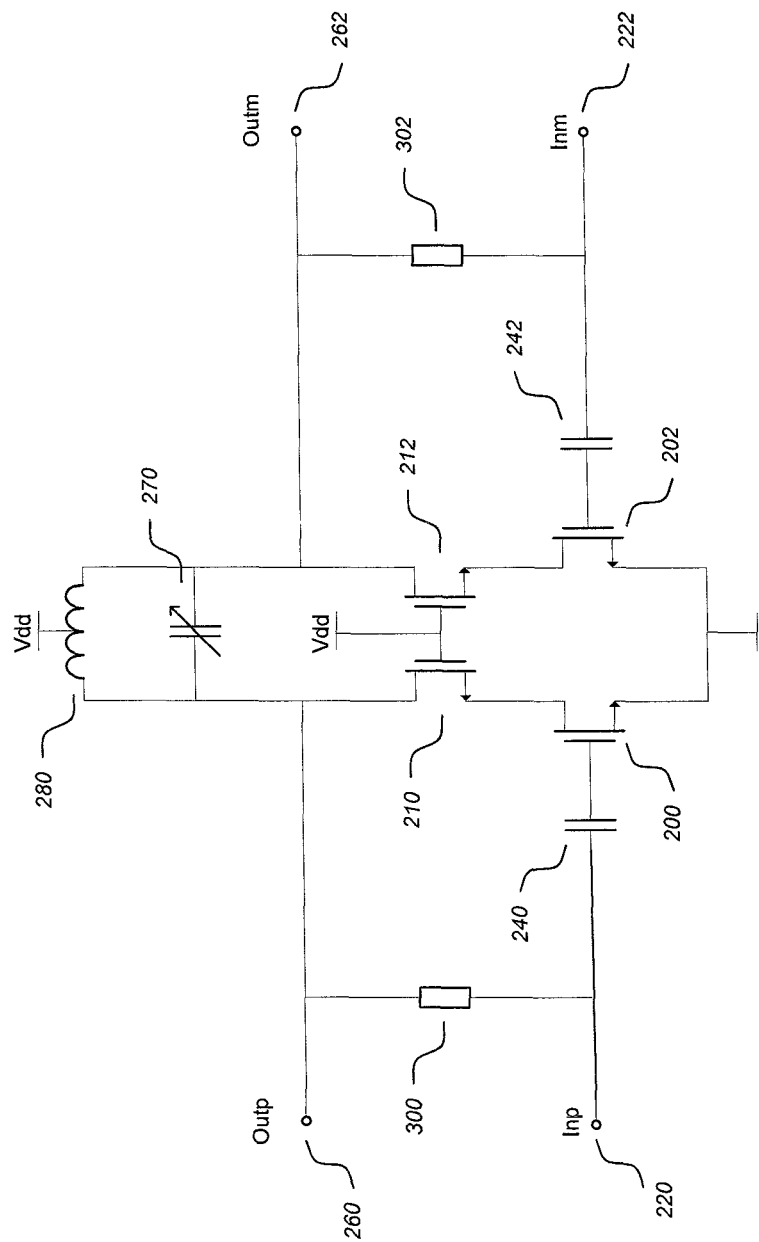
FIG. 14 is a circuit diagram of a resistive feedback LNA according to embodiments.

An exemplary resistive feedback LNA circuit is depicted in FIG. 14. As with the inductively degenerated LNA of FIG. 11, the LNA of FIG. 14 is a differential amplifier, where transistors 200 and 210 form the positive or 'plus' side of the differential amplifier, and transistors 202 and 212 form the negative or 'minus' side of the differential amplifier.

There are several differences between the topology of the resistive feedback LNA of FIG. 14 and that of the inductively degenerated LNA of FIG. 11, including the following:

Firstly, no inductor Ldeg, which provides inductive degeneration of the source terminals of the input transistors M2_p,m in the inductively degenerated LNA of FIG. 11, is present in the resistive feedback LNA of FIG. 14. Instead, the source terminals of input transistors 200 and 202 of the resistive feedback LNA of FIG. 14 are connected directly to ground.

Secondly, output terminal 260, i.e. the output terminal of the plus side of the differential amplifier, is connected to input terminal 220, i.e. the input of the plus side of the differential amplifier, via a feedback resistor 300. Similarly, output terminal 262, i.e. the output terminal of the minus side of the differential amplifier, is connected to input terminal 222, i.e. the input terminal of the minus side of the differential amplifier, via a feedback resistor 302. Feedback resistors 300 and 302 thus provide resistive feedback to the plus and minus sides of the differential amplifier, respectively.

Thirdly, an important difference between these LNA topologies is the configurability of the input matching frequency. In the resistive feedback topology, the optimum input matching frequency follows the output swing at the output. When the gain at the resistive feedback LNA output is set to the desired frequency by tuning a resonator load applied to the output, the input matching is observed at the same frequency. This can be understood by calculating the input impedance value of the resistive feedback topology which is approximately defined by $Z_{in}=(R_{fb}+Z_L)/(1+G_m*Z_L)$, where $R_{fb}$ is the feedback resistor value, $Z_L$ is the load impedance and $G_m$ is the transconductance of the input device. This is in contrast to the input matching of the inductively degenerated LNA topology which is generally more fixed to a certain frequency.

Finally, no external matching components Lextp and Lextm are provided in the resistive feedback LNA of FIG. 14. Input transistors 200 and 202 are thus directly connected to the 220 and 222 input terminals, respectively, via decoupling capacitors 240 and 242, respectively.

Rather than requiring external matching components in order to match the impedance to which the input terminals 220 and 222 are connected (where the impedance to be matched to is for example the output impedance of an RF filter preceding the LNA), the resistive feedback LNA of FIG. 14 is capable of matching the impedance connected to input terminals 220 and 222 internally within the LNA.

There are no external matching components Lextp and Lextm present in the resistive feedback LNA of FIG. 14 that provide a passive voltage gain prior to capacitors 240 and 242, as described above for the inductively degenerated LNA of FIG. 11, so the noise effects of input transistors 200 and 202 are not mitigated. In addition, there are additional noise sources in the resistive feedback LNA of FIG. 14 due to the feedback loops between the output terminals 260 and 262 and input terminals 220 and 222 of the LNA. The input referred noise from both the configurable load and the feedback loops increases as the resistance of feedback resistors 300 and 302 decreases.

In general, the noise performance of the resistive feedback LNA of FIG. 14 is worse compared to the inductively degenerated LNA of FIG. 11. However, since the resistive feedback LNA of FIG. 14 does not require external matching components Lextp and Lextm, nor inductor Ldeg for inductive degeneration, the overall cost of the resistive feedback LNA of FIG. 14 is lower compared to that of the inductively degenerated LNA of FIG. 11.

Embodiments relate to an LNA circuit that can be configured between one of a first topology in which the low noise amplifier circuit comprises a degeneration inductance such that the low noise amplifier circuit operates as an inductively degenerated low noise amplifier, and a second topology in which the low noise amplifier circuit comprises a feedback resistance such that the low noise amplifier circuit operates as a resistive feedback low noise amplifier. In the first topology, external matching components are used in conjunction with the LNA for input impedance matching purposes. In the second topology, input impedance matching is carried out using components internal to the LNA topology; no external matching components are required in the second topology. Input impedance matching may for example involve matching to the output impedance of an RF filter connected to one or more inputs of the LNA.

Figure 15:
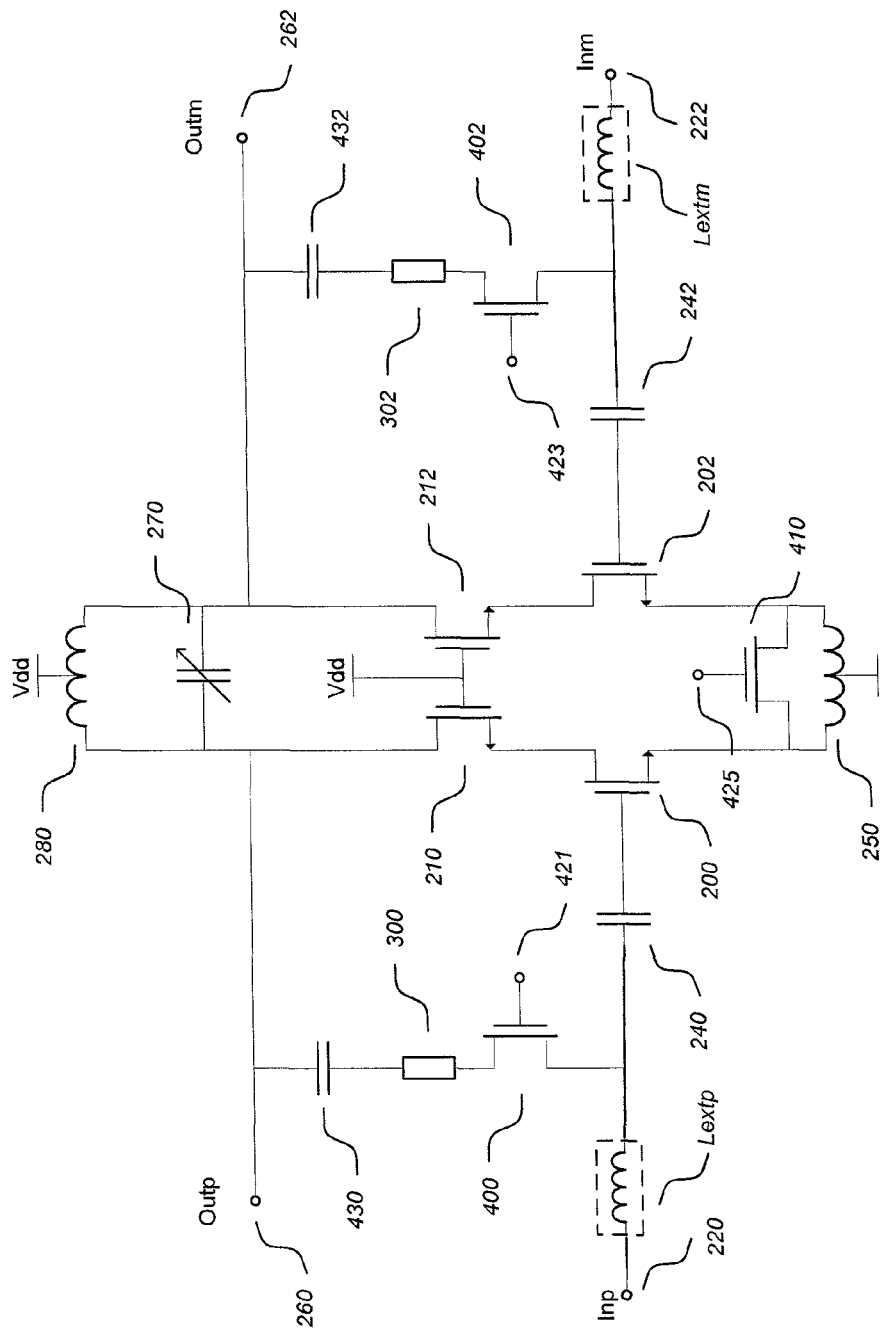
FIG. 15 is a circuit diagram of a configurable LNA according to embodiments.

An exemplary configurable LNA circuit according to the invention is illustrated in FIG. 15. As with the LNAs of FIGS. 11 and 14, the exemplary LNA of FIG. 15 is a differential amplifier, where transistors 200 and 210 form the positive or 'plus' side of the differential amplifier, and transistors 202 and 212 form the negative or 'minus' side of the differential amplifier.

The topology of the configurable LNA of FIG. 15 necessarily contains some similar features to both the inductively degenerated low noise amplifier of FIG. 11 and the resistive feedback LNA of FIG. 14; however, there are several important differences which include the following:

Firstly, the configurable LNA of FIG. 15 contains a switching arrangement for configuring the LNA between one of the first topology and the second topology. In embodiments, the switching arrangement contains a number of topology switching functions.

Secondly, similarly to the resistive feedback LNA of FIG. 14, the configurable LNA of FIG. 15 includes feedback resistor 300 on the plus side of the differential amplifier. However, rather than feedback resistor 300 on the plus side of the differential amplifier being connected directly to input terminal 220, feedback resistor 300 is connected to a topology switching function, in this case switching transistor 400, that is in turn connected to input terminal 220. One of the drain terminal and source terminal of switching transistor 400 is connected to feedback resistor 300, whilst the other terminal is coupled to input terminal 220. The gate terminal of switching transistor 400 is connected to a configuration control signal terminal 421. Topology switching function 400 is thus connected between the gate of input transistor 200 (via decoupling capacitor 240) and feedback resistor 300.

Thirdly, similarly to the resistive feedback LNA of FIG. 14, the configurable LNA of FIG. 15 includes feedback resistor 302 on the minus side of the differential amplifier. However, rather than feedback resistor 302 on the minus side of the differential amplifier being connected directly to input terminal 222, feedback resistor 302 is connected to a topology switching function, in this case switching transistor 402, that is in turn connected to input terminal 222. One of the drain terminal and source terminal of switching transistor 402 is connected to feedback resistor 302, whilst the other terminal is coupled to input terminal 222. The gate terminal of switching transistor 402 is connected to a configuration control signal terminal 423. Topology switching function 402 is thus connected between the gate of input transistor 202 (via the decoupling capacitor 242) and feedback resistor 302.

Fourthly, similarly to the inductively degenerated LNA of FIG. 11, an inductor 250 is present in the configurable LNA of FIG. 15.

Fifthly, a topology switching function, in this case a switching transistor 410, is connected between the source terminals of input transistors 200 and 202. One of the drain terminal and source terminal of switching transistor 410 is connected to the source terminal of input transistor 200, whilst the other terminal is connected to the source terminal of input transistor 202. The gate terminal of switching transistor 410 is connected to a configuration control signal terminal 425.

Sixthly, decoupling capacitors 430 and 432 provide DC decoupling from the supply voltage in order to increase switching performance of switching transistors 400 and 402 respectively.

By applying appropriate configuration control signals to configuration control terminals 421, 423 and 425, switching transistors 400, 402 and 410 can be switched between an open state, whereby the configurable LNA of FIG. 15 is configured in the first topology, and a closed state, whereby the configurable LNA of FIG. 15 is configured in the second topology.

The first and second topologies that the configurable LNA can be configured between using the topology switching functions will now be described in more detail.

In the first topology, switching transistors 400, 402 and 410 are configured to an open state. By configuring switching transistors 400 and 402 to an open state, feedback resistors 300 and 302 are effectively disconnected from the input signals applied to input terminals 220 and 222, respectively. As a result, there is no feedback loop present between the output terminals 260 and 262 and the input terminals 220 and 222, respectively.

By configuring switching transistor 410 to an open state, the source terminals of input transistors 200 and 202 are effectively connected only via inductor 250, whose centre-tap is connected to ground. Inductor 250 therefore provides inductive degeneration of the source terminals of input transistors 200 and 202, as in the inductively degenerated LNA of FIG. 11.

The configurable LNA thus operates as an inductively degenerated LNA when switching transistors 400, 402 and 410 are switched to an open state, i.e. when the configurable LNA is configured in the first topology.

Therefore, when configured in the first topology, the configurable LNA does not provide internal input impedance matching, for example matching to the output impedance of a preceding RF filter connected to input terminals 220 and 222. As a result, the input impedance of the configurable LNA of FIG. 15 should be matched, for example to a preceding RF filter, by connecting external impedance matching components, for example external matching components 230 and 232 as depicted in the inductively degenerated LNA of FIG. 11, in-between decoupling capacitors 240, 242 and input terminals 220 and 222 respectively.

The first topology of the configurable LNA of FIG. 15 thus provides the benefits of the inductively degenerated LNA of FIG. 11, i.e. relatively low noise figure, but requires the use of external matching components in order to provide input impedance matching.

In the second topology, switching transistors 400, 402 and 410 are configured to a closed state. By configuring switching transistors 400 and 402 to a closed state, feedback resistors 300 and 302 are effectively connected to the input terminals 220 and 222, respectively. As a result, a feedback loop is present between output terminals 260 and 262 and input terminals 220 and 222, respectively (and thus the input terminals of input transistors 200 and 202, respectively, via decoupling capacitors 240 and 242).

The configurable LNA thus operates as a resistive feedback LNA when switching transistors 400, 402 and 410 are configured to a closed state, i.e. when the configurable LNA is configured in the second topology.

Therefore, when configured in the second topology, the configurable LNA provides internal input impedance matching, for example matching to the output impedance of a preceding RF filter connected to input terminals 220 and 222. As a result, external matching components, for example external matching components Lextp and Lextm as depicted in the inductively degenerated LNA of FIG. 11, are not required when the configurable LNA is configured in the second configuration state.

When the configurable LNA of FIG. 15 is configured in the second topology, switching transistor 410 is configured to a closed state; this provides additional benefits, as will now be described.

By configuring switching transistor 410 to a closed state, the source terminals of the input transistors 200 and 202 are effectively connected (i.e. short-circuited). The connection formed by switching transistor 410 between the source terminals of input transistors 200 and 202 is in parallel to inductor 250 which connects the source terminals of the input transistors 200 and 202.

As in the inductively degenerated LNA of FIG. 11, inductor 250 is a differential inductor device with mutual coupling. The mutual coupling of the differential inductor device causes the inductor to operate differently for common-mode signals applied to the differential amplifier, compared to differential-mode signals applied to the differential amplifier.

Common-mode signals applied to the differential amplifier are signal components that have the same magnitude and same phase in the respective input signals applied to input terminals 220 and 222. In contrast, differential-mode signals are signal components that have the same magnitude and opposite phase in the respective input signals applied to input terminals 220 and 222.

For differential-mode signals that are applied to the input terminals 220 and 222, when the configurable LNA is configured in the second topology, the connection formed by switching transistor 410 between the source terminals of input transistors 200 and 202 forms a virtual ground for the differential signal.

However in relation to common-mode signals that are applied to the input terminals 220 and 222, when the configurable LNA is configured in the second topology, inductor 250 remains active, providing an inductance equivalent to:

$$(1-k)/2 * L_n \quad (1)$$

between the source terminals of input transistors 200 and 202 and ground (which is connected to the centre-tap of inductor 250), where k is the mutual coupling coefficient of inductor 250, and $L_n$ is a nominal inductance based on the electrical length of inductor 250.

Thus, when the configurable LNA is configured in the second topology, the inductance provided by inductor 250 (as per equation (1) above) in relation to common-mode signals forms an impedance that serves to attenuate interference and other noise from the ground voltage supply. The power supply noise rejection performance, for example as demonstrated by a higher Power Supply Rejection Ratio (PSRR) metric, of the configurable LNA when configured in the second topology is thus improved. The degeneration inductance provided by inductor 250 is thus adapted to provide a power supply noise rejection impedance when the configurable LNA is configured in the second topology.

The configurable LNA enables such improvements in PSRR in a resistive feedback LNA topology by 'borrowing' the inductor Ldeg from the inductively degenerated LNA topology. The 'borrowing' of inductor Ldeg also ensures that an expensive (in terms of chip area) on-chip component from the first topology of the configurable LNA is used in both configurations of the configurable LNA.

Additionally, when the configurable LNA is configured in the second topology, the inductance provided by inductor 250 (as per equation (1) above) in relation to common-mode signals forms a degeneration inductor for the source terminals of input transistors 200 and 202. As described above in relation to the inductively degenerated LNA of FIG. 11, such a degeneration inductor serves to improve the common-mode rejection performance, for example as demonstrated by a higher CMRR metric, of the configurable LNA when configured in the second topology. The degeneration inductance provided by inductor 250 is thus adapted to provide a common-mode signal rejection impedance in relation to signal components common to input signals applied to input terminals 220 and 222 when the configurable LNA is configured in the second topology.

The configurable LNA enables such improvements in CMRR in a resistive feedback LNA topology by 'borrowing' the inductor Ldeg from the inductively degenerated LNA of FIG. 11. The 'borrowing' of the inductor Ldeg also ensures that an expensive (in terms of chip area) on-chip component from the first topology of the configurable LNA is used in both configurations of the configurable LNA.

The configurable LNA of FIG. 15 thus provides an LNA that can be configured according to the desired use case or design requirements.

The LNA can be configured in the first topology if a more sensitive LNA with a better noise figure is required, at the cost of a need for one or more external matching components, e.g. Lextp and Lextm, in order to provide impedance matching for the inputs of the configurable LNA.

Alternatively, the LNA can be configured in the second topology in order to provide a more cost effective solution.

Additionally, when the configurable LNA is configured in the second topology, the use of inductor 250 provides an improvement in the PSRR and CMRR of the LNA over the resistive feedback LNA of FIG. 14. This results in the re-use of an expensive on-chip inductor component that can consume a significant amount of chip area of the configurable LNA.

Embodiments involve an LNA topology that provides input impedance matching capabilities without requiring use of external input impedance matching components. This topology is referred to herein as a 'signal reusing' topology, the reasons for which will be explained below with reference to FIGS. 16 to 18.

The signal reusing LNA has wideband matching for differential as well as for common mode signals. Therefore, the good differential linearity is also retained for common mode signals. A further gain stage parallel to the input impedance matching stage increases the LNA gain. The amplified signal at the output of the input impedance matching stage is reused in order to decrease the noise contribution of the following transistors. In addition, the signal reusing LNA can be biased without the need for large-value AC-coupling capacitors at the LNA input. Due to the lack of passive voltage gain prior to the signal reusing LNA input stage, the noise figure is higher compared to an inductively degenerated LNA. Furthermore, there are additional noise sources in addition to the gain transistors. However, since the signal reusing LNA does not require external components nor an additional on-chip source inductor for input impedance matching, the overall cost is much lower compared to an inductively degenerated LNA.

The signal reusing topology provides a cost-efficient solution. Certain exemplary embodiments of this disclosure achieve high gain and therefore reduce the noise contribution of processing stages following an LNA. This can be seen when applying Friis' equation: the noise factors for subsequent components are divided by the power gain of a preceding LNA. Certain exemplary embodiments of differential LNA provide good input impedance matching over a wide bandwidth for differential as well as for common-mode signals, which in turn results in good common-mode linearity. An LNA according to some embodiments has compensation for temperature, process, corner, and ageing effects and offers no restrictions when choosing an interface to mixer and analogue baseband components. In some embodiments, the LNA removes the need for direct current (DC)-coupling capacitors for input transistor devices, which leads to a smaller die area being used when compared to prior art LNAs.

Figure 16:
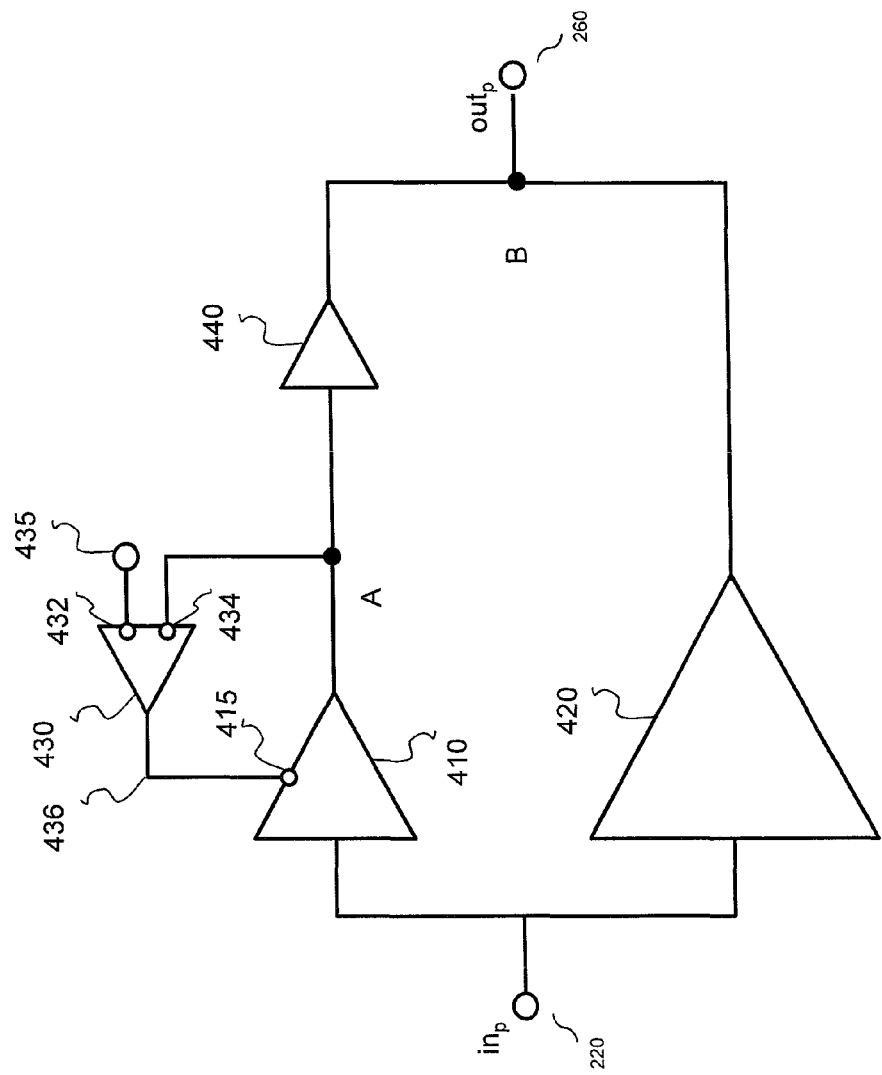
FIG. 16 is a block diagram of a signal reusing low noise amplifier according to embodiments.

FIG. 16 shows a schematic illustration of one or more stages in one of the sides of a differential amplifier of a signal reusing LNA according to embodiments. Certain features of the differential amplifier are omitted, such as a coupling to a further side of the differential amplifier and ground, to better demonstrate the conceptual aspects of the embodiments.

The stages shown in FIG. 16 have a signal inp applied at input terminal 220. The input terminal is coupled to an impedance matching stage 410. The impedance matching stage 410 acts to match an input impedance seen at the input terminal 220. For example, one or more components of the impedance matching stage 410 may have a combined impedance that matches any impedance of receiver processing stages upstream of the LNA such as a front-end module, RF filter, duplex filter, etc.

The input terminal 220 is further electrically coupled to a gain stage 420, i.e. the impedance matching stage 410 and the gain stage 420 are both coupled in parallel to the input terminal 220. Having a gain stage 420 in parallel with the impedance matching stage 410 increases the gain of the LNA. As approximately illustrated by the relative size of the stages in FIG. 16, the gain of the gain stage 420 is greater than any gain provided by the impedance matching stage 410. Gain stage 420 is coupled to the output terminal 260 at which output signal outp is produced.

The output of the impedance matching stage 410 (node A) is coupled to a feedback stage 430. The output of the impedance matching stage 410 also contributes to the output outp of the system, in the present example, via a second gain, signal processing or signal reuse stage 440. In other embodiments, the impedance matching stage 410 may be coupled to the output terminal 260 without signal reuse stage 440, for example via other components that maintain a high impedance at node A, such that the LNA still provides adequate impedance matching. In the example of FIG. 16, the outputs of the signal reuse stage 440 and the gain stage 420 are combined to produce output signal outp. This may be achieved by coupling the outputs of both stages at node B so that two output current signals are constructively combined. In some embodiments, both the gain stage 420 and the signal reuse stage share the same DC current path thus optimising the current consumption of the LNA.

By coupling the output of the impedance matching stage 410 to the output terminal 260, e.g. via signal reuse stage 440, it may be said that the result of the impedance matching stage 410 is "reused", i.e. is subsequently used to produce the output of the amplifier, in the present example via a further gain stage. For example, the impedance matching functionality of the impedance matching stage 410 could be provided without electrically coupling the impedance matching stage 410 to the output terminal 260, e.g. without any coupling between node A and node B. In certain embodiments, the reuse of a signal that has been processed, and in some cases amplified, by the impedance matching stage 410 decreases noise contributions, i.e. contributions to the noise factor, provided by one or more transistors that implement the LNA. For example, amplification provided by the impedance matching stage 410 decreases the noise contribution of following stages in the LNA, e.g. amongst other, current buffer or load stages. In certain embodiments, a current buffer stage (not shown) may be provided before the output, i.e. between node B and output terminal 260. This buffer stage may buffer the current signal from the gain stage 420 and the signal reuse stage 440. In a differential embodiment, the conceptual features of FIG. 16 are typically replicated in a second, minus side of the differential amplifier for input signal inm.

In some embodiments, the impedance matching stage 410 uses feedback stage 430. In the example of FIG. 16, the feedback stage 430 comprises a feedback amplifier, however other functionally similar feedback arrangements with or without gain may be used in other implementations. In FIG. 16, the output of the impedance matching stage 410, which may comprise a current and voltage at point A, is coupled to an inverting input 434 of the feedback amplifier.

Figure 17:
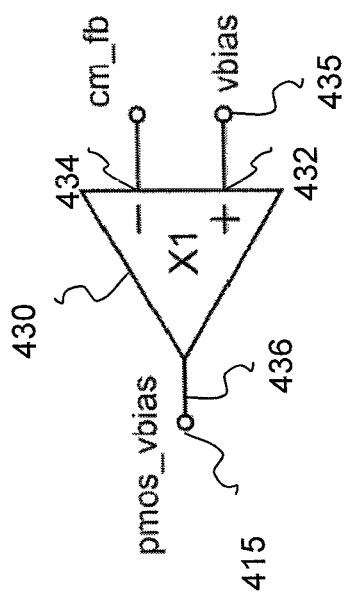
FIG. 17 illustrates a common-mode feedback amplifier according to embodiments.

One embodiment of the feedback amplifier (labelled X1 in figure) is shown in more detail in FIG. 17. The non-inverting input 432 of the amplifier is coupled to a voltage source 435, which provides a configurable voltage bias, vbias. The voltage bias vbias may be an internally or externally created bias voltage (from the perspective of an integrated LNA). It may be generated using a resistor and a constant current for example. It may also use a proportional to absolute temperature (PTAT) current or voltage reference to accommodate changes in temperature. The output 436 of the feedback stage 430 is coupled to a voltage bias 415 for the impedance matching stage 410, i.e. a voltage that is used to set an operating point for the impedance matching stage 410. Hence, the feedback provided by feedback stage 430, in use and over time, sets the (DC) voltage at node A to the applied voltage bias vbias. For example, this may be achieved in steady state operation.

In certain embodiments, the voltage at node A defines an input bias voltage for the impedance matching stage 410 and the gain stage 420 (see description of FIG. 18 below). This has the advantage of avoiding the use of any AC-coupling capacitors and bias resistors to bias the input voltages of stages 410 and 420, thus reducing the cost and size of an integrated LNA. The feedback stage 430 compensates for temperature and corner variations in one or more transistor devices that make up the LNA, such as transistors that implement the impedance matching stage 410. By changing the voltage bias 415 of at least the impedance matching stage 410 the LNA can compensate for corner effects and ageing. This is important in mass-produced circuits (i.e. mass produced LNAs) where the circuits need to be robust to compensate for variation inherent in the mass production process. The feedback stage 430 also improves productivity by enabling configuration of the LNA to optimise performance, e.g. by compensating for at least one of corner, temperature, and ageing variations that can reduce performance. By using the feedback stage, an input bias voltage for the impedance matching state 410 and the gain stage 420 can be provided without large value alternating current (AC) coupling capacitors or bias resistors at the input to the LNA being required. As large value AC coupling capacitors are typically of a large size, this further avoids the need for a large die area. In addition, the lack of bias resistors results in a better noise factor performance in blocking conditions.

FIG. 17 shows an implementation of feedback stage 430 that is, for example, suitable for use in the LNA of FIG. 18 described below. This implementation uses a feedback amplifier X1 to provide common-mode feedback functionality. The non-inverting input 432 of amplifier X1 is coupled to a voltage source, for example source 435 in FIG. 16, which provides the configurable voltage bias, vbias. The output 436 of the feedback stage 430 is coupled to a voltage bias 415 for a PMOS (P-channel metal-oxide-semiconductor field-effect transistor, PMOS being shorthand for P-MOSFET) transistor that implements impedance matching stage 410. The PMOS voltage bias pmos_vbias and the common-mode feedback input cm_fb may be coupled to the equivalent point in FIG. 18, as described below. The common-mode feedback circuit X1 compensates for temperature and corner variations in one or more transistor devices that make up the LNA, such as NMOS transistors. By changing the PMOS voltage bias pmos_vbias, a NMOS/PMOS ratio can be kept constant across different temperature, ageing and process effects. As described above, this offers a more robust solution.

A specific circuit implementation of an embodiment of the disclosure will now be described with reference to FIG. 18. It should be noted that variations to the LNA may be possible while retaining the same functional effects, for example, one resistor could be replaced with two resistors in series or components could be rearranged while still maintaining an equivalent electrical circuit. Hence, the specific circuit implementation of FIG. 18 should not be seen as limiting.

Figure 18:
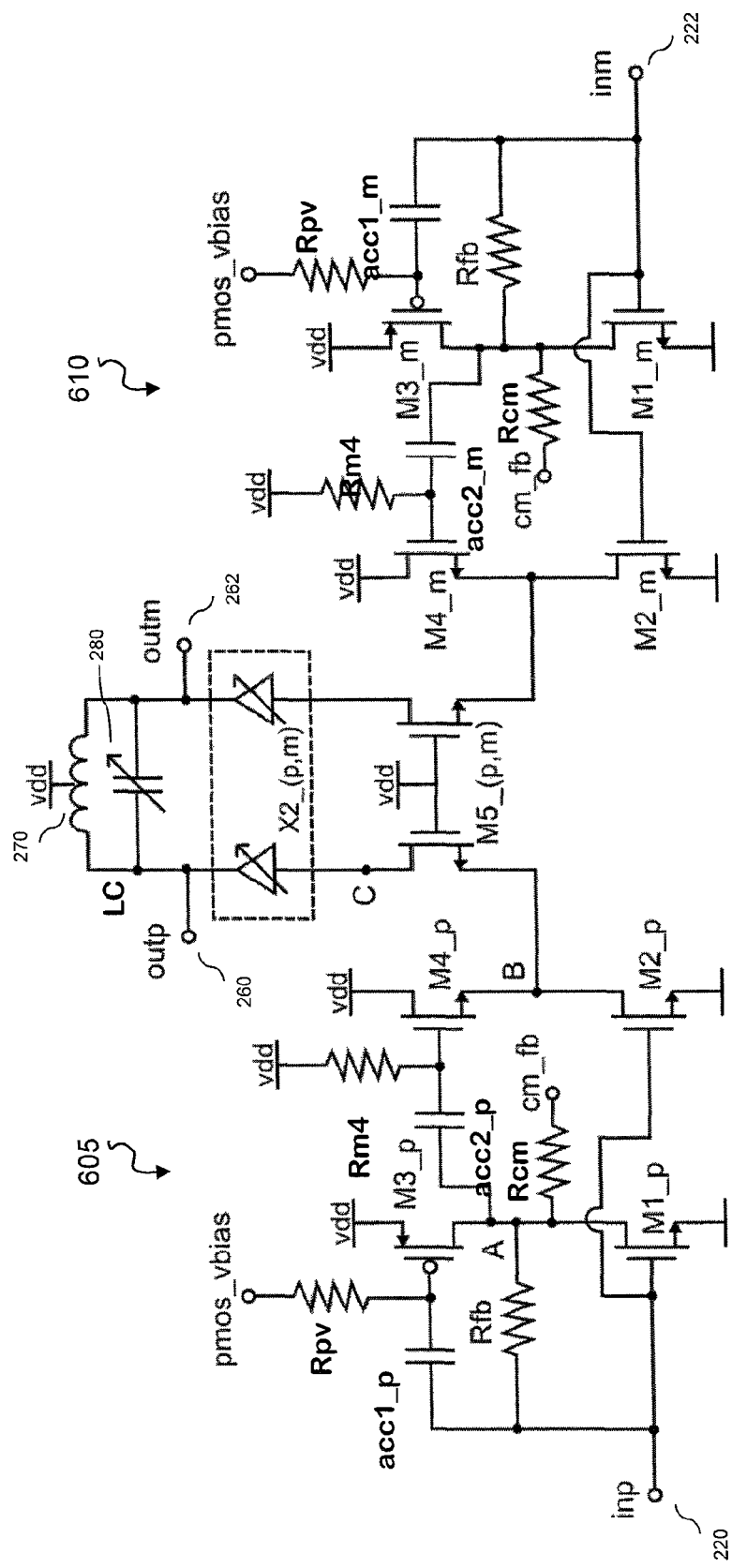
FIG. 18 is a circuit diagram of a signal reusing low noise amplifier according to embodiments.

The LNA circuit of FIG. 18 has two sides, 605 and 610, which together form a differential amplifier. Differential side 605 is arranged to process input signal inp provided at terminal 220 whereas differential side 610 is arranged to process input signal inm provided at terminal 222. Differential side 605 produces an output signal outp at output terminal 260 and differential side 610 produces an output signal outm at output terminal 262. The topology of FIG. 18 is symmetrical, i.e. the configuration of the first differential amplifier side 605 is replicated in the second differential amplifier side 610. The first differential amplifier side 605 may relate to a non-inverting, "plus" or positive side and the second differential amplifier side 610 may relate to an inverting, "minus" or negative side of an LNA (or vice versa). In the description below only the first differential amplifier side 605 will be discussed in detail, but the functionality equally applies to the corresponding second differential amplifier side 610. In certain embodiments, the functionality of the first differential amplifier side may alternatively be implemented without the second differential amplifier side to provide a single-ended amplifier.

In FIG. 18, an impedance matching stage, such as stage 410 in FIG. 16, is implemented by transistors M1_p and M3_p and feedback resistor Rfb. In this example, transistor M1_p is an NMOS transistor and transistor M3_p is a PMOS transistor. Transistors M1_p and M3_p form a feedback portion of the LNA. The gate terminal of transistor M1_p is coupled to input terminal 220. The source terminal of transistor M1_p is coupled to ground. The drain terminal of transistor M1_p is coupled to the drain terminal of transistor M3_p via node A. The source terminal of transistor M3_p is coupled to voltage supply vdd. The gate terminal of transistor M3_p is coupled to input terminal 220 via AC coupling capacitor acc1_p and is also coupled to pmos_vbias, a PMOS voltage bias provided by feedback amplifier X1, via a resistor Rpv. AC coupling capacitor acc1_p enables an AC signal to pass through from input terminal 220 to the gate of transistor M3_p but blocks any DC component so as to isolate the DC voltage bias seen at the gate of transistor M3_p from that seen at the gate of transistor M1_p. This enables the DC voltage bias seen at the gate of the transistor M3_p to be set by pmos_vbias. In this example, applying the PMOS voltage bias pmos_vbias to the gate of PMOS transistor M3_p implements the application of a voltage bias to impedance matching stage 410 as described above with regard to FIG. 16.

Resistor Rpv acts to separate the two differential amplifier sides 605 and 610 (i.e. p and m). Without this resistor in each differential amplifier side, the PMOS gates of each differential amplifier side would short-circuit via the gate connections of M3_p and M3_m. In the example of FIG. 18, pmos_vbias is coupled to the output pmos_vbias of amplifier X1 as shown in FIG. 17. The same pmos_vbias is also applied to the other differential side, i.e. both pmos_vbias nodes are coupled to the pmos_vbias output of feedback amplifier X1. To provide their AC coupling function, the AC coupling capacitor acc1_p need only have a small capacitance, for example less than 1 pF. This minimises the parasitic capacitance at critical nodes within the circuit and minimises the cost and die area required by circuit capacitors.

The transconductances of devices M1_p and M3_p with feedback resistor Rfb match the input impedance of the LNA shown in FIG. 18 to a desired source impedance. For example, in certain implementations this input impedance may be 100 ohms differential, 50 ohms single-ended. Node A may be considered to be the output of an impedance matching stage implemented by transistors M1_p and M3_p and feedback resistor Rfb. Node A is also coupled to the common-mode feedback input cm_fb of amplifier X1 as shown in FIG. 17 via resistor Rcm. Any voltage signal at node A is sensed using resistor Rcm without interfering with any AC signal present at node A. This then provides a voltage input signal cm_fb for feedback amplifier X1 as shown in FIG. 17. As described above, a voltage bias vbias is applied to amplifier X1. Feedback amplifier X1, which implements common-mode feedback stage 430, acts to modify the PMOS voltage bias signal pmos_vbias that biases PMOS transistor M3_p (e.g. sets the operating point for the transistor by setting the voltage at the gate of the transistor) such that, in use, the voltage at node cm_fb equals the voltage bias vbias. As the voltage at node A defines the input bias voltage for M1_p, and the input bias voltage for gain transistor M2_p as described below, the input bias voltages for the impedance matching stage 410 and the gain stage 420 are, in this example, based on vbias.

In FIG. 18, a gain stage is implemented by gain transistor M2_p in differential amplifier side 605 and gain transistor M2_m in differential amplifier side 610. In FIG. 18, these transistors are NMOS transistors. The gate terminal of gain transistor M2_p is coupled to the input terminal 220. Hence, the gate terminal is subject to a (DC) voltage bias as set by the voltage at point A and feedback resistor Rfb, i.e. the same voltage bias set for transistor M1_p. The source terminal of gain transistor M2_p is coupled to ground. The drain terminal of gain transistor M2_p is coupled to node B. By providing an input bias voltage for transistors M1_p and M2_p, which in the present example respectively implement the impedance matching stage 410 and the gain stage 420, using the voltage at node A, the use of bias resistors and/or AC-coupling capacitors to bias (i.e. provide a bias input voltage for the gates of) M1_p and M2_p can be avoided. This not only reduces the cost and size of an integrated LNA but it avoids adding to the noise factor of the LNA as discussed above.

In FIG. 18, a signal reuse stage is implemented by transistor M4_p. The source terminal of transistor M4_p is also coupled to node B. A gate terminal of transistor M4_p is coupled to voltage supply vdd via resistor Rm4. In other embodiments, the voltage bias for transistor M4_p could be replaced with an alternate bias voltage, for example a proportion of vdd such as 0.75*vdd. Typically, the gate voltage bias, vdd in this case, is selected such that transistor M4_p operates as a linear amplifier. The gate terminal of transistor M4_p is further coupled to node A via AC coupling capacitor acc2_p. Again, capacitor acc2_p need only be small, e.g. <1 pF, so as to isolate the DC voltage bias applied to the gate terminal of transistor M4_p from the DC voltage of node A but so as to allow AC signal components to pass and be amplified by transistor M4_p. In this way, a signal reuse stage implemented by M4_p, acc2_p, and Rm4 buffers a voltage signal at point A to a current signal input to point B. As can be seen from FIG. 18, each differential amplifier side only requires a minimum of two AC coupling capacitors which reduces costs and the required die area.

As well as providing an impedance matching function, by its arrangement the impedance matching stage further amplifies the input signal inp, i.e. acts as a constant transconductance (gm) amplifier, to produce an amplified (AC) signal at node A. This amplified signal is "reused" in the first gain stage. In FIG. 18, the amplified signal at node A is applied to the gate terminal of transistor M4_p, which further amplifies the signal to produce a further amplified signal at node B with high current and low noise characteristics. In other comparative examples, node A need not be coupled to a further portion of differential side 605, i.e. the impedance matching function could be achieved without the coupling of node A and the gate terminal of transistor M4_p. However, certain embodiments use ("reuse" when considering a first use as part of the impedance matching function) the signal at node A to provide better LNA performance. In certain alternative embodiments, another form of coupling other than a buffer or amplifying transistor may be used such that the signal at A is reused at B.

In FIG. 18 a current cascode or current buffer stage is implemented by transistor M5_p. In FIG. 18, transistor M5_p is an NMOS transistor. A source terminal of transistor M5_p is electrically coupled to node B. A drain terminal of transistor M5_p is electrically coupled to node C. A gate terminal of transistor M5_p is coupled to voltage source vdd (as well as a gate terminal of transistor M5_m, which forms part of the second differential side 610). For sufficient performance, the gate bias voltage of transistor M5_m should follow the gate bias voltage of transistor M4_m. For example, if the voltage bias for transistor M4_p were replaced with an alternate bias voltage, such as 0.75*vdd, the voltage bias for transistor M5_m should also be replaced with alternate bias voltage (e.g. 0.75*vdd). Node C is at least coupled to output terminal 260 and a tuneable LC resonator 270, 280. The tuneable LC resonator implements a configurable load that is at least electrically coupled to both drain terminals of transistors M5_p,m. In embodiments, the tuneable LC resonator comprises a variable capacitor in parallel with a centre-tap differential inductor; the centre-tap differential inductor is electrically coupled to the voltage supply vdd.

Note that a gate terminal DC voltage for transistors M5_p,m can be set to a level other than vdd, such that the drain voltage of gain transistor M2_p can be set to a desired level in order to increase the available voltage swing at the drain terminal of transistor M5_p. If the gate terminal DC voltage for transistors M5_p,m is to be changed, it is recommended to also change the gate terminal DC voltage for transistor M4_p accordingly, so as to maintain sufficient performance characteristics. In some implementations, a current steering cascode X2 may be provided between the drain terminal of each of transistors M5_p,m and the tuneable LC resonator/each output. A current steering cascode may be used to add gain control between M5_p and the output terminal 260 or to provide further current buffering if required.

In FIG. 18, transistors M5_p and M2_p are thus arranged in a cascode configuration, with M2_p providing a common source amplifier and M5_p providing a common gate amplifier. M2_p further shares a common DC current path with both M4_p and M5_p. Transistor M2_p has the largest transconductance (and the highest drain current) of the NMOS transistors. The signal currents though transistors M4_p and M2_p are added constructively at point B which increases the current gain. Node B thus outputs from the gain stage a high signal current with low noise to the cascode or buffer stage, which is then fed as a current through the M5_p cascode transistor, which is in turn followed by the tuneable LC resonator 270, 280.

At least resistors Rcm, Rpv, and Rm4 have large values, i.e. values with an order of magnitude around 10 kOhms. The exact values of the resistors, and the capacitors, described herein may be selected using standard design practices, based on implementation specifications.

By reusing a signal generated as part of an impedance matching stage, the current consumption of the LNA can be reduced.

Certain embodiments described herein provide an advantage of achieving good noise performance, i.e. having a low noise factor, without external matching components. Certain embodiments also have a low current consumption, for example when compared with known resistive feedback LNAs. Embodiments can comprise a fully integrated differential amplifier on a single chip. By suitably biasing gain and impedance matching stages, in particular transistors implementing those stages, at least one of accurate gain, linearity, noise, and input impedance matching may be achieved despite at least one of differing manufacturing processes, temperature effects, variations in supply voltage and aging conditions. Certain embodiments enable the transconductances of MOSFET devices to be accurately set to mitigate the aforementioned variations. In one embodiment, this is achieved by biasing transistors M1 and M2 using resistive feedback and a DC bias point set with a constant transconductance circuit and a common-mode feedback stage. The use of at least the resistive feedback further avoids the need to use additional DC-biasing resistors to bias voltages seen by transistors M1 and M2. Embodiments described herein minimise the number of biasing resistors and AC-coupling capacitors, such that costs and die area, i.e. the area taken up by an integrated chip on a substrate, are minimised. This makes certain embodiments attractive for implementations requiring a number of LNAs for different frequency bands.

Certain LNA embodiments presented herein provide common-mode matching and good common-mode linearity. They further provide wideband input impedance matching, i.e. impedance matching across a wide range of RF signal frequencies. This wideband matching occurs without the need for specific frequency calibration. For example, the topology of FIG. 18 is capable of matching frequencies in the range 0 to 3 GHz. This is due to there being an absence of frequency selecting components in the topology and the lack of any inductors as a source load, as for example is found with an inductively degenerated LNA. This results in better attenuation against far away signal blockers such as transmitters, wireless networks and Bluetooth™ signals, as for example compared to known resistive feedback LNAs. Wideband matching further avoids degradation of duplex filter performance, which may occur if the impedance matching does not occur over the frequency range processed by the duplex filter. It also avoids desensitising of a receiver front end and intermodulation products.

The topology of the signal reusing LNA of FIG. 18 bears some similarity to that of the inductively degenerated LNA of FIG. 11; however, there are several differences as follows:

Firstly, no inductor Ldeg, which provides inductive degeneration of the source terminals of gain transistors M2_p,m in the inductively degenerated LNA of FIG. 11, is present in the signal reusing LNA of FIG. 18. Instead, the source terminals of input transistors M2_p,m of the gain stage of the signal reusing LNA of FIG. 18 are connected directly to ground.

Secondly, output terminal 260, i.e. the output terminal of the plus side of the differential amplifier, is connected to input terminal 220, i.e. the input of the plus side of the differential amplifier, via input impedance matching, feedback and signal reusing stages. The minus side of the differential amplifier is similarly connected.

Thirdly, no external matching components Lextp and Lextm are provided in the signal reusing LNA of FIG. 18. Input transistors M2_p,m are thus directly coupled to input terminals 220 and 222, respectively.

Rather than requiring external matching components in order to match the impedance to which the input terminals 220 and 222 are connected (where the impedance to be matched to is for example the output impedance of an RF filter preceding the LNA), the signal reusing LNA of FIG. 18 is capable of matching the impedance connected to input 220 and 222 internally within the LNA.

There are no external matching components Lextp and Lextm present in the signal reusing LNA of FIG. 18 that provide a passive voltage gain prior to transistors M1_p,m, M2_p,m, as described above for the inductively degenerated LNA of FIG. 11, so the noise effects of gain transistors M2_p, m are not mitigated. In addition, there are additional noise sources in the signal reusing LNA of FIG. 18 between the output terminals 260 and 262 and input terminals 220 and 222 of the LNA.

In general, the noise performance of the signal reusing LNA of FIG. 18 is worse compared to the inductively degenerated LNA of FIG. 11. However, since the signal reusing LNA of FIG. 18 does not require external matching components Lextp and Lextm, nor inductor Ldeg for inductive degeneration, the overall cost of the signal reusing LNA of FIG. 18 is lower compared to that of the inductively degenerated LNA of FIG. 11.

Some embodiments relate to an LNA circuit that can be configured between one of a first topology in which the low noise amplifier circuit comprises a degeneration inductance such that the low noise amplifier circuit operates as an inductively degenerated low noise amplifier, and a second topology, referred to herein as a signal reusing topology.

The signal reusing topology comprises an impedance matching stage coupled to an input of the configurable low noise amplifier circuit and a feedback stage coupled to an output of the impedance matching stage and a voltage source. The output of the impedance matching stage provides an input bias voltage for the impedance matching stage. The feedback stage provides a compensated operating voltage for the impedance matching stage.

In the first topology, one or more external input impedance matching components are used in conjunction with the LNA for input impedance matching purposes. In the second topology, input impedance matching is carried out using components internal to the LNA topology; no external matching components are required in the second topology. Input impedance matching may for example involve matching to the output impedance of an RF filter connected to one or more inputs of the LNA.

Figure 19:
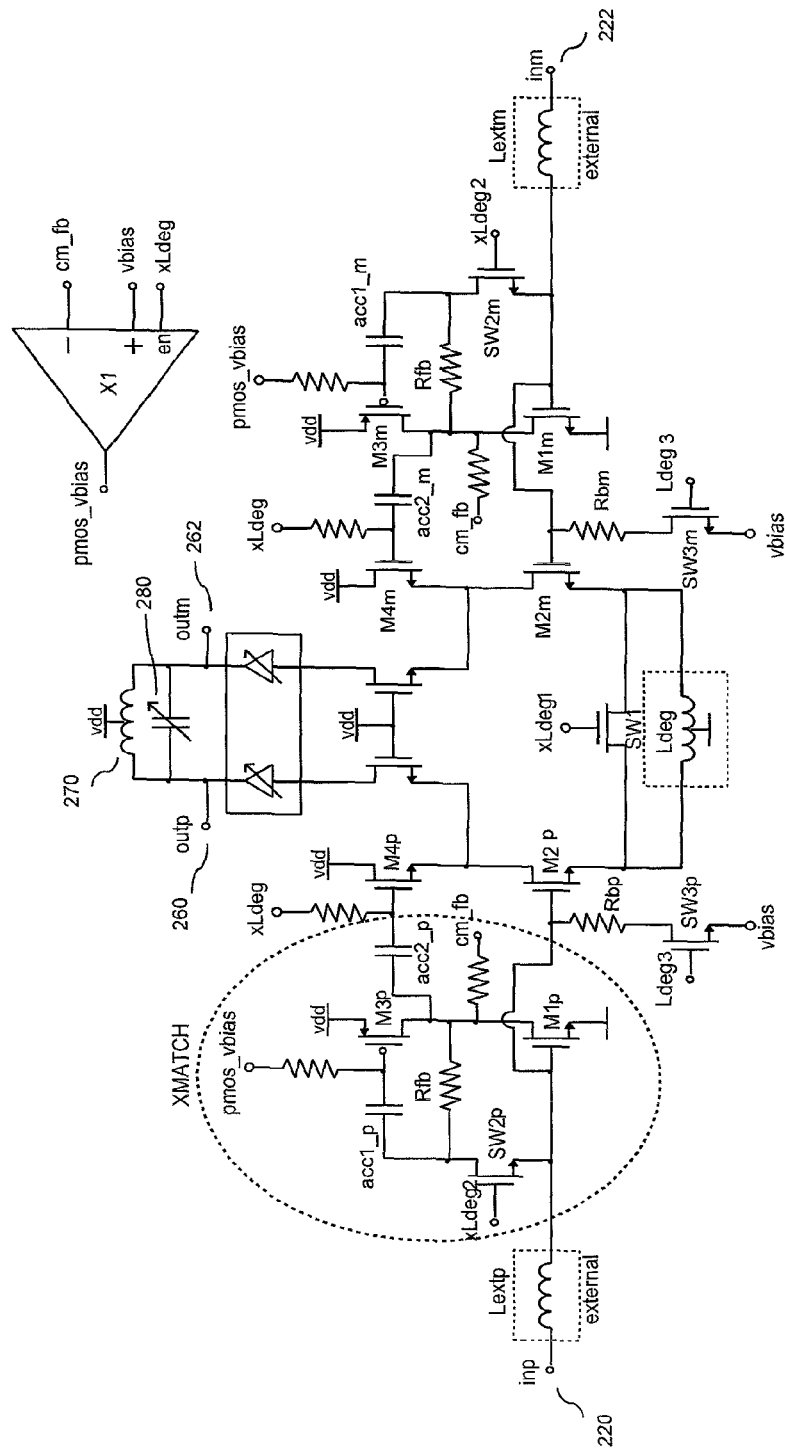
FIG. 19 is a circuit diagram of a configurable low noise amplifier according to embodiments.

An exemplary configurable LNA circuit according to embodiments is illustrated in FIG. 19. As with the LNAs of FIG. 11 and FIG. 18, the exemplary configurable LNA of FIG. 19 is a differential amplifier; other embodiments may equally apply to a non-differential amplifier.

The topology of the configurable LNA of FIG. 19 necessarily contains some similar features to both the inductively degenerated low noise amplifier of FIG. 11 and the signal reusing LNA of FIG. 18; however, there are several important differences which include the following:

Firstly, the configurable LNA of FIG. 19 contains a switching arrangement for configuring the LNA between one of the first inductively degenerated topology and the second, signal reusing topology. The switching arrangement comprises a number of topology switching functions.

Secondly, similarly to the signal reusing LNA of FIG. 18, the configurable LNA of FIG. 19 includes input impedance stage 410, feedback stage 430 and signal reusing stage 440. However, rather than input impedance matching stage 410 on the plus side of the differential amplifier being connected directly to input terminal 220, input impedance matching stage 410 is connected to a topology switching function, in this case switching transistor SW2$p$, that is in turn coupled to input terminal 220. Specifically, the drain terminal of switching transistor SW2$p$ is connected to feedback resistor Rfb and AC coupling capacitor acc1_$p$, whilst the source terminal is connected to input terminal 220. The gate terminal of switching transistor SW2$p$ is connected to a configuration control signal terminal xLdeg2. Topology switching function SW2$p$ is thus connected between the gate of transistor M1_$p$ and feedback resistor Rfb and AC coupling capacitor acc1_$p$. The minus side of the differential amplifier is similarly connected with a topology switching function SW2$m$ connected to the gate of transistor M1_$m$.

Thirdly, a topology switching function, in this case a switching transistor SW1, is connected between the source terminals of gain transistors M2_$p$ and M2_$m$. One of the drain terminal and source terminal of switching transistor SW1 is connected to the source terminal of M2_$p$, whilst the other terminal is connected to the source terminal of M2_$m$. The gate terminal of switching transistor SW1 is connected to a configuration control signal terminal xLdeg1.

Fourthly, rather than the gate terminal of gain transistor M2_$p$ on the plus side of the differential amplifier being directly connected to a bias voltage source vbias via a first bias resistor Rbp, a topology switching function, in this case a switching transistor SW3$p$, is connected between the first bias resistor Rbp and the bias voltage source vbias. Specifically, the drain terminal of switching transistor SW3$p$ is connected to Rbp, whilst the source terminal is connected to vbias. Similarly, on the minus side of the differential amplifier a topology switching function, in this case a switching transistor SW3$m$, is connected between the second bias resistor Rbm and the bias voltage source vbias.

By applying appropriate configuration control signals to configuration control terminals xLdeg1, xLdeg2 and Ldeg3, switching transistors SW1, SW2$p,m$ can be switched to an open state and SW3$p,m$ can be switched to a closed state, whereby the configurable LNA of FIG. 19 is configured in the first, inductively degenerated topology. Conversely, by applying appropriate configuration control signals to configuration control terminals xLdeg1, xLdeg2 and Ldeg3, switching transistors SW1, SW2$p,m$ can be switched to a closed state and SW3$p,m$ can be switched to an open state, whereby the configurable LNA of FIG. 19 is configured in the second, signal reusing topology.

The configurable low noise amplifier can be configured between the first and second topologies by using a switching arrangement. The switching arrangement comprises a number of topology switching functions, which in embodiments comprise switching transistors.

In the first inductively degenerated topology, switching transistors SW1 and SW2$p,m$ are configured to an open state and switching transistors SW3$p,m$ are configured to a closed state.

By configuring switching transistors SW2$p$ to an open state, this prevents current flowing through transistors M1_$p,m$. This means that the impedance matching stage 410 of each side of the differential amplifier is effectively disconnected from the input signals inp, inm applied to respective input terminals 220 and 222.

Switching transistors SW3$p,m$ are configured to a closed state by application of an appropriate control signal Ldeg3 in order to apply the bias voltage vbias directly to the gates of gain transistors M2_$p,m$.

The configurable low noise amplifier circuit is configurable in the first topology by coupling the output of feedback amplifier X1 of feedback stage 430 on both the plus and minus sides of the differential amplifier to the positive supply voltage vdd in order to close the M3_$p,m$ transistors. In embodiments, since the feedback amplifier X1 is not in use in the first topology, the common mode feedback amplifier X1 on both the plus and minus sides of the differential amplifier is disabled by connecting its enable input to an appropriate control signal.

The configurable low noise amplifier circuit is configurable in the first topology by closing the signal reusing M4_$p,m$ transistors. This can be achieved by applying an appropriate control signal to the gates of the M4_$p,m$ transistors, for example a relatively low control signal compared to when the configurable low noise amplifier circuit is configured in the second topology.

Figure 20:
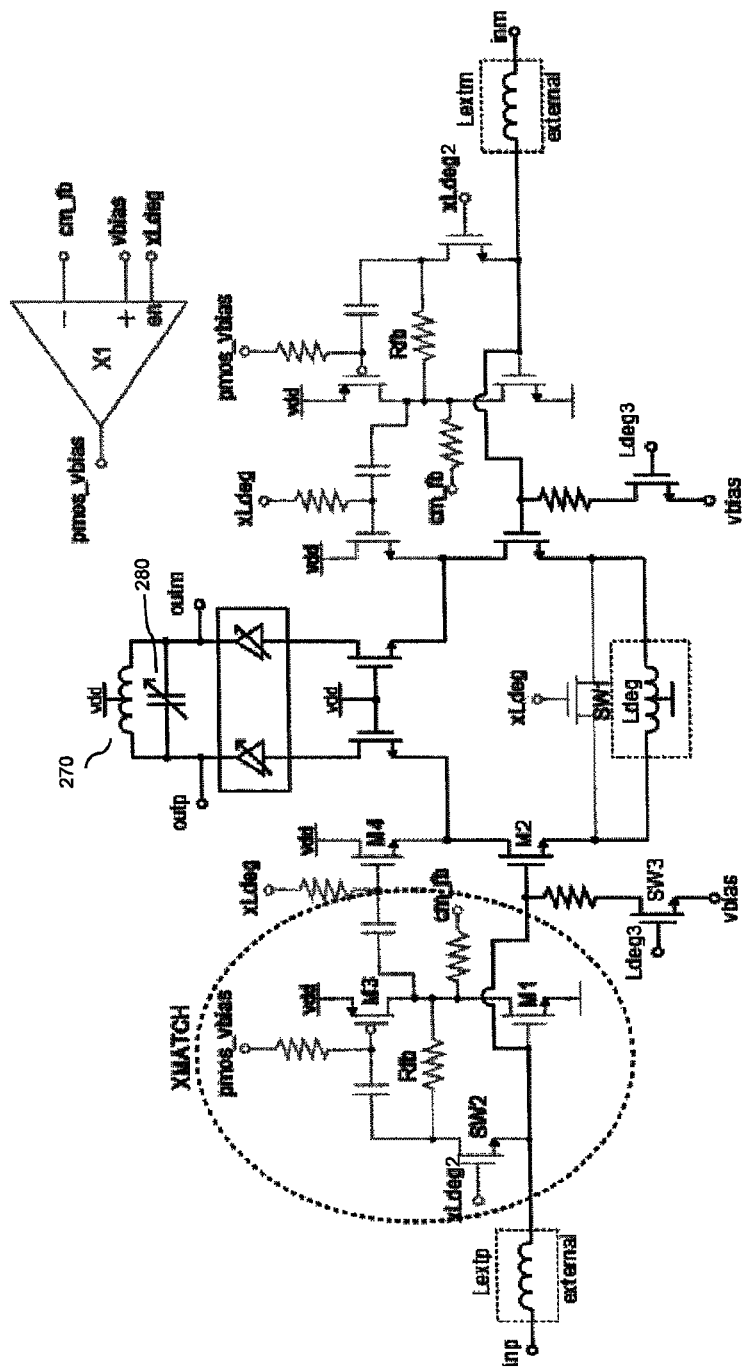
FIG. 20 is a circuit diagram of a configurable low noise amplifier configured in an inductively degenerated topology according to embodiments.

This configuration mode is depicted in FIG. 20. Transistors M1_$p,m$, M3_$p,m$ and M4_$p,m$ are closed and therefore not affecting the circuit operation (such components being shown in grey instead of black in FIG. 20). In addition, the common mode feedback of feedback amplifier X1 is disabled and the bias resistors Rpv and Rcm connected to X1 in addition to resistor Rfb have no effect on the operation of the configurable low noise amplifier. Since in this configuration the input impedance matching stage (denoted XMATCH in FIGS. 19 and 20) is disabled, input impedance matching is achieved using external matching components Lextp and Lextm.

By configuring switching transistor SW1 to an open state, the source terminals of input transistors M2_$p,m$ are effectively connected only via inductor Ldeg, whose centre-tap is connected to ground. Inductor Ldeg therefore provides inductive degeneration of the source terminals of input transistors M2$p,m$, as in the inductively degenerated LNA of FIG. 11.

The configurable LNA thus operates as an inductively degenerated LNA when switching transistors SW1 and SW2p,m are configured to an open state and switching transistors SW3p,m are configured to a closed state, i.e. when the configurable LNA is configured in the first topology.

Therefore, when configured in the first topology, the configurable LNA does not provide internal input impedance matching, for example matching to the output impedance of a preceding RF filter connected to input terminals 220 and 222. As a result, the input impedance of the configurable LNA of FIG. 20 should be matched, for example to a preceding RF filter, by connecting external impedance matching components, for example external matching components Lextp and Lextm as depicted in the inductively degenerated LNA of FIG. 11.

The first topology of the configurable LNA of FIG. 19 thus provides the benefits of the inductively degenerated LNA of FIG. 11, i.e. relatively low noise figure, but requires the use of external matching components in order to provide input impedance matching.

In the second, signal reusing topology, switching transistors SW1 and SW2p,m are configured to a closed state and switching transistors SW3p,m are configured to an open state. In this operation mode, input impedance matching stage 410 and feedback stage 430 (collectively denoted XMATCH in FIG. 19) and signal coupling stage 440 are connected such that the circuit operation is identical to that of the signal reusing LNA depicted in FIG. 18. Input impedance matching is achieved (via XMATCH) without use of any external matching components such as Lextp and Lextm.

In embodiments, the configurable low noise amplifier circuit is configurable in the second topology by decoupling the output of feedback amplifier X1 of feedback stage 430 on both the plus and minus sides of the differential amplifier from the positive supply voltage vdd such that the M3_p,m transistors are open. Further, the common mode feedback amplifier X1 on both the plus and minus sides of the differential amplifier is enabled by application of an appropriate control signal to its enable input.

The configurable low noise amplifier circuit is configurable in the second topology by opening the signal reusing M4_p,m transistors. This can be achieved by applying an appropriate control signal to the gates of the M4_p,m transistors, for example a relatively high control signal compared to when the configurable low noise amplifier circuit is configured in the first topology.

When configured in the second topology, the configurable LNA provides internal input impedance matching, for example matching to the output impedance of a preceding RF filter connected to input terminals 220 and 222. As a result, external matching components, for example external matching components Lextp and Lexpm as depicted in the inductively degenerated LNA of FIG. 11, are not required.

When the configurable LNA of FIG. 19 is configured in the second topology, switching transistor SW1 is configured to a closed state; this provides additional benefits, as will now be described.

By configuring switching transistor SW1 to a closed state, the source terminals of gain transistors M2_p,m are effectively connected (i.e. short-circuited). The connection formed by switching transistor SW1 between the source terminals of gain transistors M2_p,m is in parallel to inductor Ldeg which connects the source terminals of gain transistors M2_p,m.

As in the inductively degenerated LNA of FIG. 11, inductor Ldeg is a differential inductor device with mutual coupling. The mutual coupling of the differential inductor device causes the inductor to operate differently for common-mode signals applied to the differential amplifier, compared to differential-mode signals applied to the differential amplifier.

Common-mode signals applied to the differential amplifier are signal components that have the same magnitude and same phase in the respective input signals inp, inm applied to input terminals 220 and 222. In contrast, differential-mode signals are signal components that have the same magnitude and opposite phase in the respective input signals applied to input terminals 220 and 222.

For differential-mode signals that are applied to the input terminals 220 and 222, when the configurable LNA is configured in the second topology, the connection formed by switching transistor SW1 between the source terminals of input transistors M2_p,m forms a virtual ground for the differential signal.

However in relation to common-mode signals that are applied to the input terminals 220 and 222, when the configurable LNA is configured in the second topology, inductor Ldeg remains active, providing an inductance equivalent to:

$$(1-k)/2 * L_n \qquad (2)$$

between the source terminals of gain transistors M2_p,m and ground (which is connected to the centre-tap of inductor Ldeg), where k is the mutual coupling coefficient of inductor Ldeg, and $L_n$ is a nominal inductance based on the electrical length of inductor Ldeg.

Thus, when the configurable LNA is configured in the second topology, the inductance provided by inductor Ldeg (as per equation (2) above) forms an impedance that serves to attenuate interference and other noise from the ground voltage supply. The power supply noise rejection performance, for example as demonstrated by a higher Power Supply Rejection Ratio (PSRR) metric, of the configurable LNA when configured in the second topology is thus improved. The degeneration inductance provided by inductor Ldeg is thus adapted to provide a power supply noise rejection impedance when the configurable LNA is configured in the second topology.

The configurable LNA enables an improvement in the PSRR in a signal reusing LNA topology by 'borrowing' the inductor Ldeg from the inductively degenerated LNA topology. The 'borrowing' of inductor Ldeg also ensures that an expensive (in terms of chip area) on-chip component from the first topology of the configurable LNA can be used in both configurations of the configurable LNA.

Additionally, when the configurable LNA is configured in the second topology, the inductance provided by inductor Ldeg (as per equation (2) above) in relation to common-mode signals forms a degeneration inductor for the source terminals of gain transistors M2_m,p. As described above in relation to the inductively degenerated LNA of FIG. 11, such a degeneration inductor serves to improve the common-mode rejection performance, for example as demonstrated by a higher CMRR metric, of the configurable LNA when configured in the second topology. The degeneration inductance provided by inductor Ldeg is thus adapted to provide a common-mode signal rejection impedance in relation to signal components common to input signals applied to input terminals 220 and 222 when the configurable LNA is configured in the second topology.

The configurable LNA enables an improvement in the CMRR in a signal reusing LNA topology by 'borrowing' the inductor Ldeg from the inductively degenerated LNA of FIG. 11. The 'borrowing' of the inductor Ldeg also ensures that an expensive (in terms of chip area) on-chip component from the first topology of the configurable LNA can be used in both configurations of the configurable LNA.

The configurable LNA of FIG. 19 thus provides an LNA that can be configured according to the desired use case or design requirements.

The LNA can be configured in the first topology if a more sensitive LNA with a better noise figure is required, at the cost of a need for external matching components, e.g. Lextp and Lextm, in order to provide impedance matching for the inputs of the configurable LNA.

Alternatively, the LNA can be configured in the second topology in order to provide a more cost effective solution.

Additionally, when the configurable LNA is configured in the second topology, the use of inductor Ldeg provides an improvement in the PSRR and CMRR of the LNA over the signal reusing LNA of FIG. 18. This results in the re-use of an expensive on-chip component (i.e. inductor Ldeg) that can consume a significant amount of chip area of the configurable LNA.

The above embodiments are to be understood as illustrative examples of the invention. Further embodiments of the invention are envisaged.

In the embodiments of FIG. 9, the inter-band CA (in that case between RF Bands 3 and 7) is implemented using a single RFIC. In alternative embodiments, the design can be extended to comprise two separate RFICs, one RFIC for processing signals from the main FEM and one RFIC for processing signals from the DIV FEM, or one RFIC for processing signals from RF Bands 3 in both the main and DIV FEMs and another RFIC for processing signals from RF Bands 7 in both the main and DIV FEMs. Alternatively, inter-band CA may be achieved using a single RFIC and only a single (main) FEM instead of both a main FEM and a DIV FEM.

The configurable RFIC of embodiments may be configured by its manufacturer, or by a third party installing one or more configurable RFICs, for example in a device or module thereof; this may involve a method of configuring a configurable RFIC comprising one or more configurable low noise amplifier circuits. The configuring method may comprise applying one of a first set of one or more control signals to at least one of the one or more circuits to configure the at least one circuit in an internal input impedance matching topology in which the respective low noise amplifier circuit comprises one or more internal input impedance matching components adapted to match the input impedance of the respective low noise amplifier to a given input, the one or more internal input impedance matching components being located internally to the respective low noise amplifier circuit, or a second set of one or more control signals to at least one of the one or more circuits to configure the at least one circuit in a different topology in which the respective low noise amplifier circuit does not comprise the one or more internal input impedance matching components. A set of control signals may for example be applied to one or more switching transistors and/or bias voltage switching functions.

The configurable RFIC of embodiments may be included in an RF module comprising one or more RF filters located in an RF Front End Module preceding the RFIC. The RFIC may comprise input and output pins and/or wires for connecting external matching components between the configurable LNAs of the RFIC and the RF filter. An RFIC could alternatively comprise one or more RF filters connected to one or more configurable LNAs.

The configurable RFIC of embodiments can be incorporated in a number of different devices. Such a device could comprise a user equipment such as a mobile station, personal digital assistant or cellular telephony device etc.; the configurable RFIC may for example be included in a receiver of such a user equipment. Further, such a device could comprise a modem device to be attached to a user equipment, for example a Universal Serial Bus (USB) modem. Still further, such a device could comprise a communication module such as a Machine-to-Machine (M2M) module which can be inserted into another device such as a laptop computer or other device with communication capability (for example a vending machine). Yet, still further, such a device could comprise a chipset which may include radio and baseband parts.

In accordance with first embodiments, there is provided a configurable radio-frequency integrated circuit (RFIC) comprising one or more configurable low noise amplifier circuits, each of the one or more configurable low noise amplifier circuits being configurable between:

an internal input impedance matching topology in which the respective low noise amplifier circuit comprises one or more internal input impedance matching components adapted to match the input impedance of the respective low noise amplifier to a given input, the one or more internal input impedance matching components being located internally to the respective low noise amplifier circuit; and a topology different from the internal input impedance matching topology.

In some embodiments, in the different topology the respective low noise amplifier circuit does not comprise at least one of the one or more internal input impedance matching components.

In some embodiments, in the different topology the respective low noise amplifier circuit does not comprise any of the one or more internal input impedance matching components.

In embodiments, the different topology comprises a partly externally matched or a fully externally matched topology where one or more external components, i.e. components external to the configurable RFIC, are required for input impedance matching. External matching components are placed externally to the RFIC on a Printed Wiring Board (PWB) or suchlike The configurable RFIC can be configured according to the desire of the customer. Cost-efficiency and high quality and reliability can be provided by configuring one or more LNAs in the RFIC in the internal input impedance matching topology. Improved sensitivity can be provided by configuring one or more LNAs in the RFIC in the different topology where external input impedance matching components are required. Embodiments therefore provide a capability to trade-off cost against performance with a single RFIC design. This leads to a more optimal engineering and marketing solution since a variety of products with different requirements can be covered using the same RFIC.

In some embodiments, at least one of the one or more configurable low noise amplifier circuits comprises a switching arrangement, the at least one configurable low noise amplifier circuit being configurable between one of the internal input impedance matching topology and the different topology via the respective switching arrangement. Hence, the circuit can be configured in the internal input impedance matching topology or different topology according to the desired performance of the circuit.

In some embodiments, the internal input impedance matching topology comprises a resistive feedback low noise amplifier topology and the different topology comprises an inductively degenerated low noise amplifier topology. In some embodiments, the internal input impedance matching topology comprises a common-gate low noise amplifier topology and the different topology comprises an inductively degenerated low noise amplifier gate topology. In some embodiments, the different topology comprises an inductively degenerated low noise amplifier topology and the internal input impedance matching topology comprises an impedance matching stage coupled to an input of the configurable low noise amplifier circuit, the output of the impedance matching stage providing an input bias voltage for the impedance matching stage, and a feedback stage coupled to an output of the impedance matching stage and a voltage source, the feedback stage providing a compensated operating voltage for the impedance matching stage. Hence, the RFIC can support several different combinations of LNA topologies providing either impedance matching capabilities internally or requiring external matching components.

In some embodiments, each of the one or more configurable low noise amplifier circuits comprises a common output terminal at which an output signal of the respective configurable low noise amplifier circuit is provided when configured in either the internal input impedance matching topology or the different topology. Re-use of a single output terminal for both LNA topologies provides a lower cost solution for the configurable RFIC. In some embodiments, some, but not all of the one or more configurable low noise amplifier circuits in the configurable RFIC comprise a common output terminal at which an output signal of the respective configurable low noise amplifier circuit is provided when configured in either the internal input impedance matching topology or the different topology, whereas in other embodiments, all of the one or more configurable low noise amplifier circuits in the configurable RFIC comprise a common output terminal at which an output signal of the respective configurable low noise amplifier circuit is provided when configured in either the internal input impedance matching topology or the different topology.

In some embodiments, the configurable RFIC comprises an interface arranged to connect at least one of the one or more configurable low noise amplifier circuits to a radio-frequency (RF) front end module. In some embodiments, the interface comprises at least a first input connection arranged to connect at least a first one of the one or more configurable low noise amplifier circuits to a first RF band output of the RF front end module. In some embodiments, the interface comprises at least a second input connection arranged to connect at least a second one of the one or more configurable low noise amplifier circuits to a second RF band output of the RF front end module, wherein the second RF band is different from the first RF band. Hence the configurable RFIC is capable of coupling multiple RF band inputs to multiple configurable LNAs, for example in a carrier aggregation environment.

In some embodiments, the configurable RFIC comprises a further interface arranged to connect at least one of the one or more configurable low noise amplifier circuits to a further RF front end module. In some embodiments, the RF front end module comprises a main antenna RF front end module and the further RF front end module interface comprises a diversity antenna RF front end module. Hence, multiple receiver branch environments such as High Speed Downlink Packet Access (HSDPA) and LTE are supported on a single configurable RFIC.

In some embodiments, the further interface comprises at least a third input connection arranged to connect at least a third one of the one or more configurable low noise amplifier circuits to a third RF band output of the further RF front end module, wherein the first RF band comprises the third RF band, and at least a fourth input connection arranged to connect at least a fourth one of the one or more configurable low noise amplifier circuits to a fourth RF band output of the further RF front end module, wherein the third RF band is different from the fourth RF band. In some embodiments, the first RF band comprises the third RF band and the second RF band comprises the fourth RF band. Hence, the configurable RFIC supports multiple RF band inputs in both main and diversity receiver branches, for example in a carrier aggregation environment.

In embodiments, the configurable RFIC comprises at least one interface arranged to connect at least one of the one or more configurable low noise amplifier circuits to at least one antenna.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of embodiments, which is defined in the accompanying claims.

The invention claimed is:

1. A configurable radio-frequency integrated circuit (RFIC) comprising one or more configurable low noise amplifier circuits, each of said one or more configurable low noise amplifier circuits being configurable between:
  an internal input impedance matching topology in which the respective low noise amplifier circuit comprises one or more internal input impedance matching components adapted to match the input impedance of the respective low noise amplifier to a given input, said one or more internal input impedance matching components being located internally to the respective low noise amplifier circuit; and
  a topology different from said internal input impedance matching topology,
  wherein at least one of said one or more configurable low noise amplifier circuits comprises a switching arrangement,
  said at least one configurable low noise amplifier circuit being configurable between one of said internal input impedance matching topology and said different topology via the respective switching arrangement.

2. A configurable RFIC according to claim 1, wherein the different topology of the respective low noise amplifier circuit does not comprise at least one of said one or more internal input impedance matching components.

3. A configurable RFIC according to claim 1, wherein the different topology of the respective low noise amplifier circuit does not comprise any of said one or more internal input impedance matching components.

4. A configurable RFIC according to claim 1, wherein said internal input impedance matching topology comprises a resistive feedback low noise amplifier topology and said different topology comprises an inductively degenerated low noise amplifier topology.

5. A configurable RFIC according to claim 1, wherein said internal input impedance matching topology comprises a common-gate low noise amplifier topology and said different topology comprises an inductively degenerated low noise amplifier topology.

6. A configurable RFIC according to claim 1, wherein said different topology comprises an inductively degenerated low noise amplifier topology and said internal input impedance matching topology comprises:
  an impedance matching stage coupled to an input of the configurable low noise amplifier circuit, the output of the impedance matching stage providing an input bias voltage for the impedance matching stage; and a feedback stage coupled to an output of the impedance matching stage and a voltage source, the feedback stage providing a compensated operating voltage for the impedance matching stage.

7. A configurable RFIC according to claim 1, wherein each of said one or more configurable low noise amplifier circuits comprises a common output terminal at which an output signal of the respective configurable low noise amplifier circuit is provided when configured in either said internal input impedance matching topology or said different topology.

8. A configurable RFIC according to claim 1, further comprising an interface configured to connect at least one of said one or more configurable low noise amplifier circuits to a radio-frequency (RF) front end module.

9. A configurable RFIC according to claim 8, wherein said interface comprises at least a first input connection configured to connect at least a first one of said one or more configurable low noise amplifier circuits to a first RF band output of said RF front end module.

10. A configurable RFIC according to claim 9, wherein said interface further comprises at least a second input connection configured to connect at least a second one of said one or more configurable low noise amplifier circuits to a second RF band output of said RF front end module, wherein said second RF band is different from said first RF band.

11. A configurable RFIC according to claim 8, further comprising a further interface configured to connect at least one of said one or more configurable low noise amplifier circuits to a further RF front end module.

12. A configurable RFIC according to claim 11, wherein said RF front end module comprises a main antenna RF front end module and said further RF front end module interface comprises a diversity antenna RF front end module.

13. A configurable RFIC according to claim 11, wherein said further interface comprises:
at least a third input connection arranged to connect at least a third one of said one or more configurable low noise amplifier circuits to a third RF band output of said further RF front end module, wherein said first RF band comprises said third RF band; and
at least a fourth input connection arranged to connect at least a fourth one of said one or more configurable low noise amplifier circuits to a fourth RF band output of said further RF front end module, wherein said third RF band is different from said fourth RF band.

14. A configurable RFIC according to claim 13, wherein said first RF band comprises said third RF band and said second RF band comprises said fourth RF band.

15. A configurable RFIC according to claim 1, comprising at least one interface arranged to connect at least one of said one or more configurable low noise amplifier circuits to at least one antenna.

16. A method of configuring a configurable RFIC comprising one or more configurable low noise amplifier circuits, at least one of said one or more configurable low noise amplifier circuits comprises a switching arrangement, said method comprising alternatively applying:
a first set of one or more control signals to at least one of said one or more circuits to configure, via the switching arrangement, said at least one circuit in an internal input impedance matching topology in which the respective low noise amplifier circuit comprises one or more internal input impedance matching components adapted to match the input impedance of the respective low noise amplifier to a given input, said one or more internal input impedance matching components being located internally to the respective low noise amplifier circuit; and a second set of one or more control signals to at least one of said one or more circuits to configure, via the switching arrangement, said at least one circuit in a different topology in which the respective low noise amplifier circuit does not comprise said one or more internal input impedance matching components.

17. A method of manufacturing a configurable RFIC according to claim 1.

18. An RF module comprising one or more RF front end modules coupled to one or more configurable RFICs according to claim 1.

19. A chipset comprising one or more configurable RFICs according to claim 1.

20. A device comprising one or more configurable RFICs according to claim 1.

21. A configurable radio-frequency integrated circuit (RFIC) comprising one or more configurable low noise amplifier circuits, each of said one or more configurable low noise amplifier circuits being configurable between:
an internal input impedance matching topology in which the respective low noise amplifier circuit comprises one or more internal input impedance matching components adapted to match the input impedance of the respective low noise amplifier to a given input, said one or more internal input impedance matching components being located internally to the respective low noise amplifier circuit; and
a topology different from said internal input impedance matching topology,
wherein said internal input impedance matching topology comprises a resistive feedback low noise amplifier topology and said different topology comprises an inductively degenerated low noise amplifier topology.

22. A configurable radio-frequency integrated circuit (RFIC) comprising one or more configurable low noise amplifier circuits, each of said one or more configurable low noise amplifier circuits being configurable between:
an internal input impedance matching topology in which the respective low noise amplifier circuit comprises one or more internal input impedance matching components adapted to match the input impedance of the respective low noise amplifier to a given input, said one or more internal input impedance matching components being located internally to the respective low noise amplifier circuit; and
a topology different from said internal input impedance matching topology,
wherein said different topology comprises an inductively degenerated low noise amplifier topology, and
wherein said internal input impedance matching topology comprises:
an impedance matching stage coupled to an input of the configurable low noise amplifier circuit, the output of the impedance matching stage providing an input bias voltage for the impedance matching stage; and
a feedback stage coupled to an output of the impedance matching stage and a voltage source, the feedback stage providing a compensated operating voltage for the impedance matching stage.

23. A configurable radio-frequency integrated circuit (RFIC) comprising one or more configurable low noise amplifier circuits, each of said one or more configurable low noise amplifier circuits being configurable between:
an internal input impedance matching topology in which the respective low noise amplifier circuit comprises one or more internal input impedance matching components adapted to match the input impedance of the respective low noise amplifier to a given input, said one or more internal input impedance matching components being located internally to the respective low noise amplifier circuit;

a topology different from said internal input impedance matching topology; and an interface arranged to connect at least one of said one or more configurable low noise amplifier circuits to a radio-frequency (RF) front end module, wherein said interface comprises:

at least a first input connection arranged to connect at least a first one of said one or more configurable low noise amplifier circuits to a first RF band output of said RF front end module, and at least a second input connection arranged to connect at least a second one of said one or more configurable low noise amplifier circuits to a second RF band output of said RF front end module, wherein said second RF band is different from said first RF band.

24. A configurable radio-frequency integrated circuit (RFIC) comprising one or more configurable low noise amplifier circuits, each of said one or more configurable low noise amplifier circuits being configurable between:

an internal input impedance matching topology in which the respective low noise amplifier circuit comprises one or more internal input impedance matching components adapted to match the input impedance of the respective low noise amplifier to a given input, said one or more internal input impedance matching components being located internally to the respective low noise amplifier circuit;

a topology different from said internal input impedance matching topology;

an interface configured to connect at least one of said one or more configurable low noise amplifier circuits to a radio-frequency (RF) front end module; and a further interface configured to connect at least one of said one or more configurable low noise amplifier circuits to a further RF front end module.

* * * * *